United States Patent
Teraki et al.

(10) Patent No.: US 9,877,410 B2
(45) Date of Patent: Jan. 23, 2018

(54) COOLER, ELECTRICAL COMPONENT UNIT, AND REFRIGERATION APPARATUS

(71) Applicant: DAIKIN INDUSTRIES, LTD., Osaka-shi, Osaka (JP)

(72) Inventors: Junichi Teraki, Shiga (JP); Akihiko Oguri, Shanghai (CN); Masanobu Kita, Shiga (JP)

(73) Assignee: Daikin Industries, Ltd., Osaka (JP)

( * ) Notice: Subject to any disclaimer, the term of this patent is extended or adjusted under 35 U.S.C. 154(b) by 206 days.

(21) Appl. No.: 14/395,975

(22) PCT Filed: Apr. 26, 2013

(86) PCT No.: PCT/JP2013/002861
§ 371 (c)(1),
(2) Date: Oct. 21, 2014

(87) PCT Pub. No.: WO2013/161322
PCT Pub. Date: Oct. 31, 2013

(65) Prior Publication Data
US 2015/0082823 A1  Mar. 26, 2015

(30) Foreign Application Priority Data
Apr. 27, 2012 (JP) .................. 2012-103723

(51) Int. Cl.
*H05K 7/20* (2006.01)
*H05K 1/02* (2006.01)
(Continued)

(52) U.S. Cl.
CPC ........... *H05K 7/20381* (2013.01); *F24F 1/24* (2013.01); *H01L 23/4093* (2013.01);
(Continued)

(58) Field of Classification Search
CPC ...... F24F 1/24; F25B 31/006; H05K 7/20381; H01L 2924/0002
(Continued)

(56) References Cited

U.S. PATENT DOCUMENTS 2,517,411 A * 8/1950 Patterson ................ F25B 39/02
165/133
2,560,486 A * 7/1951 Shears .................... F16L 3/227
24/338

(Continued)

FOREIGN PATENT DOCUMENTS

EP  1372367 A1 * 12/2003 ......... H05K 7/20727
EP  1372367 A1   12/2003
(Continued)

OTHER PUBLICATIONS

International Search Report, dated Jul. 9, 2013, issued in PCT/JP2013/002861.

*Primary Examiner* — Ljiljana Ciric
*Assistant Examiner* — Kirstin Oswald
(74) *Attorney, Agent, or Firm* — Birch, Stewart, Kolasch & Birch, LLP

(57) ABSTRACT

A cooler is placed on a power module to cool the power module with refrigerant through a refrigerant pipe, and includes a heat transfer plate having a groove into which a cooling pipe is fitted, and a presser plate configured to press the cooling pipe against the groove. The cooler includes a hinge mechanism configured to rotatably attach the presser plate to the heat transfer plate such that the presser plate is switched between an open position at which the groove is exposed and a closed position at which the presser plate covers the groove.

10 Claims, 10 Drawing Sheets

(51) Int. Cl.
  *H01L 23/473* (2006.01)
  *H01L 23/40* (2006.01)
  *F24F 1/24* (2011.01)
  *F25B 31/00* (2006.01)

(52) U.S. Cl.
  CPC ......... *H01L 23/473* (2013.01); *H05K 1/0203* (2013.01); *H05K 7/20254* (2013.01); *H05K 7/20354* (2013.01); *H05K 7/20936* (2013.01); *F25B 31/006* (2013.01); *H01L 2924/0002* (2013.01)

(58) Field of Classification Search
  USPC ............................ 62/259.2; 361/699; 165/96
  See application file for complete search history.

(56) References Cited

U.S. PATENT DOCUMENTS

| | | | | | |
|---|---|---|---|---|---|
| 3,072,183 | A * | 1/1963 | Barbier | ................... | F24D 3/165 165/55 |
| 3,599,915 | A * | 8/1971 | Soltysik | ................... | F16B 2/065 248/68.1 |
| 4,235,285 | A * | 11/1980 | Johnson | ............... | H01L 23/4093 165/169 |
| 4,513,652 | A * | 4/1985 | Muramatsu | ............... | G10F 1/02 84/107 |
| 4,520,305 | A * | 5/1985 | Cauchy | ............... | F28D 15/0275 136/208 |
| 4,660,123 | A * | 4/1987 | Hermann | ............ | H01L 23/4093 165/185 |
| 4,716,494 | A * | 12/1987 | Bright | ................. | H01L 23/4093 165/80.3 |
| 4,791,983 | A * | 12/1988 | Nicol | ................... | H01L 23/473 165/46 |
| 5,208,731 | A * | 5/1993 | Blomquist | ......... | H01L 23/4093 174/16.3 |
| 5,251,101 | A * | 10/1993 | Liu | ..................... | H01L 23/4093 24/625 |
| 5,327,324 | A * | 7/1994 | Roth | .................. | H05K 7/20854 174/16.3 |
| 5,339,214 | A * | 8/1994 | Nelson | ...................... | G06F 1/20 165/104.33 |
| 5,475,564 | A * | 12/1995 | Chiou | ................. | H01L 23/4093 24/615 |
| 5,486,981 | A * | 1/1996 | Blomquist | .......... | H01L 23/4093 165/185 |
| 5,581,441 | A * | 12/1996 | Porter | ..................... | H01L 23/40 165/104.33 |
| 5,598,320 | A * | 1/1997 | Toedtman | ............... | F28D 15/02 165/104.33 |
| 5,621,613 | A * | 4/1997 | Haley | ...................... | G06F 1/203 165/104.33 |
| 5,638,258 | A * | 6/1997 | Lin | ..................... | H01L 23/4093 165/80.3 |
| 5,764,482 | A * | 6/1998 | Meyer, IV | ............ | H01L 23/427 165/80.4 |
| 5,826,645 | A * | 10/1998 | Meyer, IV | .............. | F28D 15/02 165/104.33 |
| 5,860,195 | A * | 1/1999 | Wang | .................. | H01L 23/4093 165/80.3 |
| 5,924,481 | A * | 7/1999 | Tajima | ................ | F28D 15/0266 165/104.21 |
| 6,301,107 | B1 * | 10/2001 | Lev | ........................ | G06F 1/203 361/670 |
| 6,366,460 | B1 * | 4/2002 | Stone | ...................... | G06F 1/203 361/679.47 |
| 6,504,720 | B2 * | 1/2003 | Furuya | ................. | H01L 23/427 165/104.33 |
| 6,830,098 | B1 * | 12/2004 | Todd | .................... | F28D 15/0275 165/104.21 |
| 7,093,648 | B1 * | 8/2006 | Cheng | .................. | H01L 23/427 165/104.33 |
| 7,180,744 | B2 * | 2/2007 | Chen | ................... | H01L 23/4093 165/80.3 |
| 7,426,112 | B2 * | 9/2008 | Chi-Wei | ............. | H01L 23/4093 165/104.26 |
| 7,866,376 | B2 * | 1/2011 | Jiang | ................... | F28D 15/0233 165/104.33 |
| 8,322,403 | B2 * | 12/2012 | Lin | ..................... | F28D 15/0233 165/80.2 |
| 2002/0036890 | A1 * | 3/2002 | Furuya | ................. | H01L 23/427 361/702 |
| 2005/0103473 | A1 * | 5/2005 | Todd | ................... | F28D 15/0275 165/104.11 |
| 2008/0310105 | A1 * | 12/2008 | Cheng | .................. | H01L 23/427 361/695 |
| 2009/0205810 | A1 | 8/2009 | Wan et al. | | |
| 2009/0229791 | A1 * | 9/2009 | Hung | ........................ | G06F 1/20 165/80.3 |
| 2009/0239424 | A1 * | 9/2009 | Maschke | ............. | H01L 23/4093 439/786 |
| 2010/0020501 | A1 * | 1/2010 | Li | ........................ | H01L 23/4006 361/710 |
| 2010/0224343 | A1 * | 9/2010 | Fukuma | ............... | B25J 19/0054 165/67 |
| 2011/0141695 | A1 * | 6/2011 | Mikami | ................. | G06F 1/203 361/707 |

FOREIGN PATENT DOCUMENTS

| | | |
|---|---|---|
| JP | 1-145136 U | 10/1989 |
| JP | 10-185003 A | 7/1998 |
| JP | 2000-74264 A | 3/2000 |
| JP | 2002-156195 A | 5/2002 |
| JP | 2007-201351 A | 8/2007 |

* cited by examiner

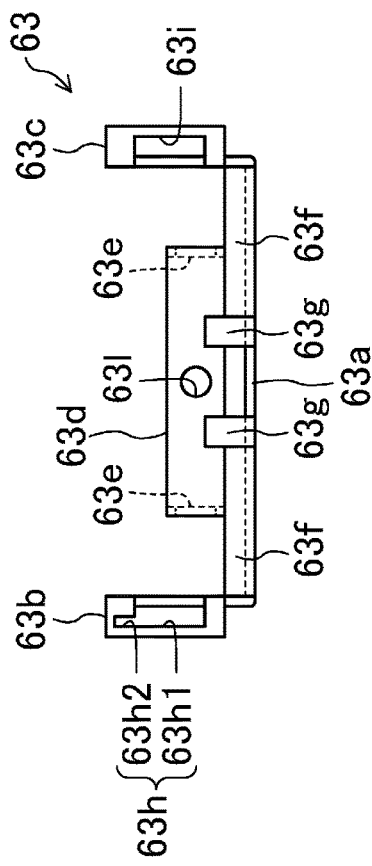
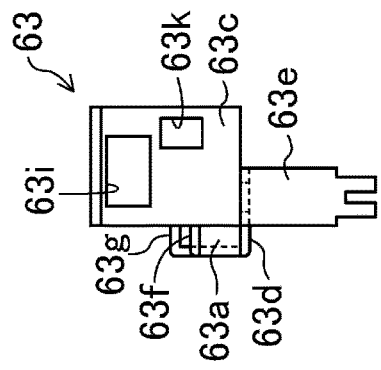
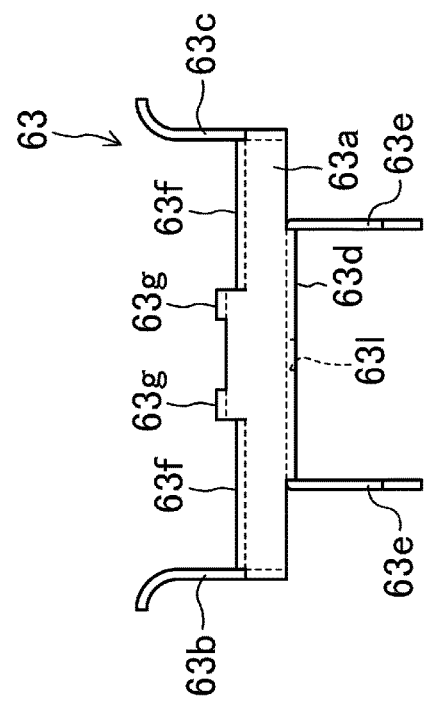
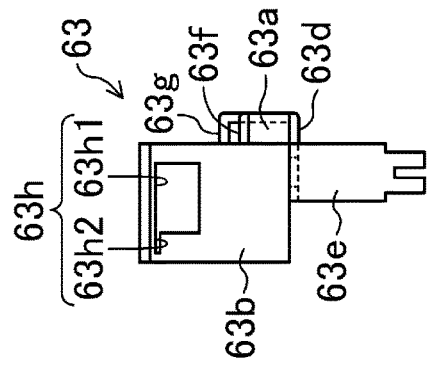
FIG.7A
FIG.7B
FIG.7C
FIG.7D

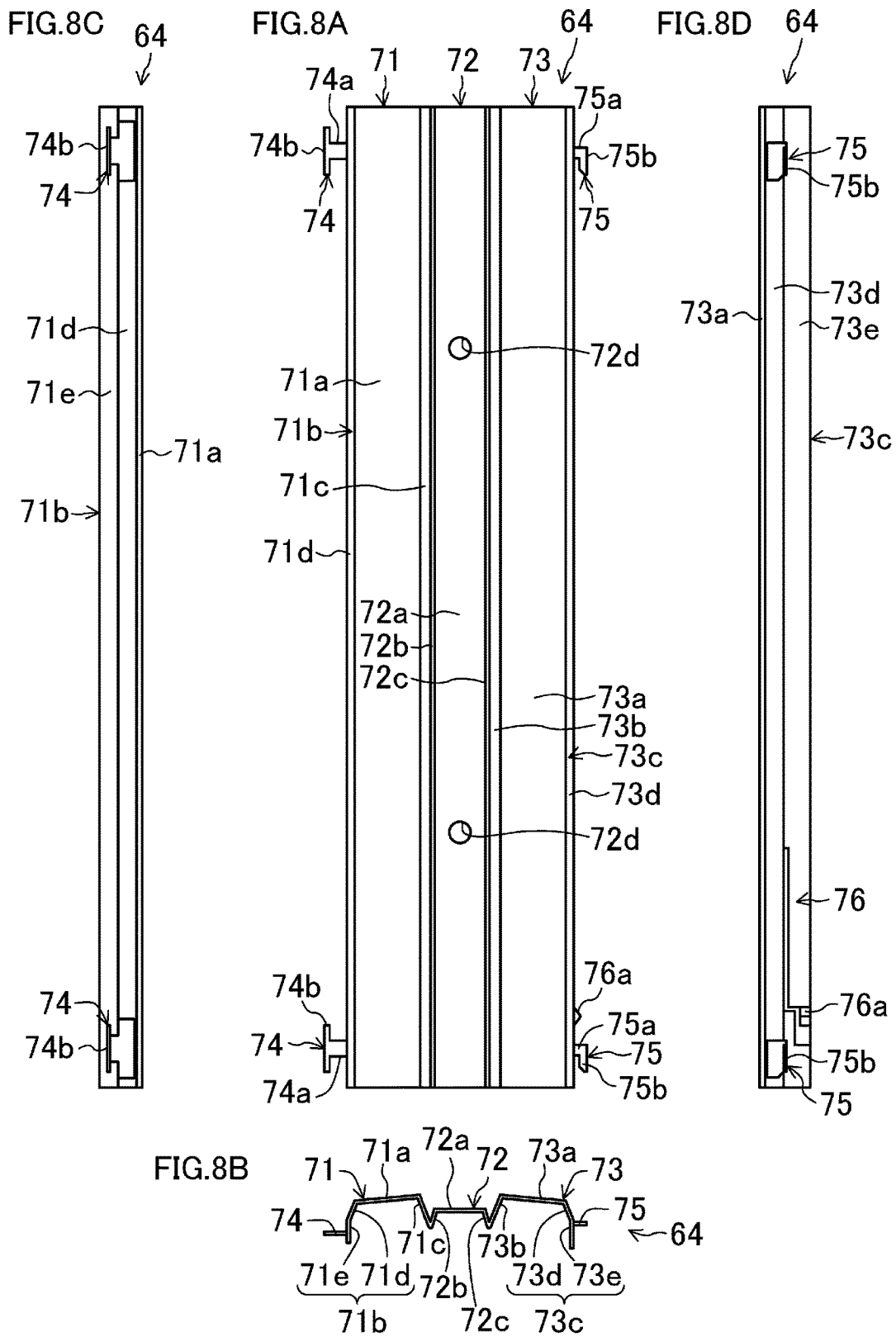

COOLER, ELECTRICAL COMPONENT UNIT, AND REFRIGERATION APPARATUS

TECHNICAL FIELD

The present invention relates to a cooler placed on a refrigerant pipe to cool a heat generating component, an electrical component unit, and a refrigeration apparatus.

BACKGROUND ART

A cooler has been conventionally used which is placed on a refrigerant pipe of a refrigerant circuit to cool a heat generating component, such as a power module, with refrigerant flowing through the refrigerant pipe (see, for example, PATENT DOCUMENT 1). Some of coolers of this type each include a heat transfer plate and a presser plate. The heat transfer plate has a groove into which a refrigerant pipe is fitted. The presser plate is configured to press the refrigerant pipe fitted into the heat transfer plate against the heat transfer plate to fix the refrigerant pipe.

In such a cooler as described above, when a refrigerant pipe is fitted into a heat transfer plate, and is pressed by a presser plate, thermally conductive grease is applied between the refrigerant pipe and the heat transfer plate to reduce the contact thermal resistance between the refrigerant pipe and the heat transfer plate, thereby enhancing the cooling performance. To facilitate placing the refrigerant pipe on the cooler, such thermally conductive grease is applied to a groove in the heat transfer plate not immediately before the placement but during manufacture of the cooler. To prevent the thermally conductive grease from being in contact with something and being removed, the cooler to which the thermally conductive grease has been applied and which includes a cover covering the groove is transported to the site of installation of the cooler, the cover is removed at the site of installation, and the refrigerant pipe is then placed on the cooler.

CITATION LIST

Patent Document

PATENT DOCUMENT 1: Japanese Unexamined Patent Publication No. 2002-156195

SUMMARY OF THE INVENTION

Technical Problem

When a cover is provided to protect thermally conductive grease as described above, the cover must be removed before the placement of a refrigerant pipe, and the removed cover needs to be discarded. Thus, unfortunately, time and effort are required to place the refrigerant pipe on the cooler, and cost is increased. In the cooler, when the presser plate is fixed to the heat transfer plate to press the refrigerant pipe against the groove, the presser plate separate from the heat transfer plate needs to be screwed while being supported with a hand, and time and effort are thus required.

It is therefore an object of the present invention to facilitate placing a refrigerant pipe on a cooler and reduce cost.

Solution to the Problem

A cooler according to a first aspect of the invention is placed on a heat generating component (53) to cool the heat generating component (53) with refrigerant through a refrigerant pipe (15), and includes a heat transfer member (62) having a groove (61) into which the refrigerant pipe (15) is fitted, and a presser plate (64) configured to press the refrigerant pipe (15) against the groove (61). The cooler includes: an opening/closing mechanism (77) configured to rotatably attach the presser plate (64) to the heat transfer member (62) such that the presser plate (64) is switched between an open position at which the groove (61) is exposed and a closed position at which the presser plate (64) covers the groove (61).

In the first aspect of the invention, the presser plate (64) is configured to press the refrigerant pipe (15) against the groove (61) of the heat transfer member (62), and is rotatably attached to the heat transfer member (62) through the opening/closing mechanism (77). The presser plate (64) rotates with the opening/closing mechanism (77) so as to be switched between the open position at which the groove (61) is exposed and the closed position at which the presser plate (64) covers the groove (61).

According to a second aspect of the invention, the cooler of the first aspect of the invention may further include: a lock mechanism (78) configured to prevent rotation of the presser plate (64) to keep the presser plate (64) closed.

In the second aspect of the invention, the lock mechanism (78) prevents the rotation of the presser plate (64) to keep the presser plate (64) closed.

According to a third aspect of the invention, in the cooler of the second aspect of the invention, the opening/closing mechanism (77) may include a rotary protrusion piece (74) protruding from an end portion of the presser plate (64) near an axis of rotation of the presser plate (64), and a rotation supporter provided on one side of the heat transfer member (62) in a width direction of the groove to engage the rotary protrusion piece (74) and rotatably support the rotary protrusion piece (74).

In the third aspect of the invention, the rotary protrusion piece (74) of the presser plate (64) engages the rotation supporter provided on the side of the heat transfer member (62) in the width direction of the groove, and is supported by the rotation supporter to rotate. This enables the rotation of the presser plate (64).

According to a fourth aspect of the invention, in the cooler of the third aspect of the invention, the lock mechanism (78) may include a locking protrusion piece (75) protruding from an end portion of the presser plate (64) remote from the axis of rotation of the presser plate (64), and a rotation stopper provided on the other side of the heat transfer member (62) that is located in the width direction of the groove and is remote from the rotation supporter, and when the closed presser plate (64) is slid in one of longitudinal directions of the groove of the heat transfer member (62), the rotation stopper may engage the locking protrusion piece (75) to prevent the rotation of the presser plate (64).

In the fourth aspect of the invention, if the closed presser plate (64) is slid in one of the directions along the groove length of the heat transfer member (62), the locking protrusion piece (75) located on the side of the presser plate (64) remote from the axis of rotation of the presser plate (64) engages the rotation stopper located on a side of the heat transfer member (62) remote from the rotation supporter in the width direction of the groove to prevent the rotation of the presser plate (64). Thus, the presser plate (64) is kept closed.

According to a fifth aspect of the invention, in the cooler of the fourth aspect of the invention, an engagement member

(63) having the rotation supporter and the rotation stopper may be placed on the heat transfer member (62).

In the fifth aspect of the invention, the engagement member (63) is placed on the heat transfer member (62), and the heat transfer member (62), therefore, includes the rotation supporter and the rotation stopper.

According to a sixth aspect of the invention, in the cooler of the fifth aspect of the invention, the engagement member (63) may include two engagement members (63, 63) each placed on a corresponding one of one end and the other end of the heat transfer member (62) along the length of the groove, the two engagement members (63, 63) may each include two engagement portions (63b, 63c) each provided on a corresponding one of both sides of the heat transfer member (62) in the width direction of the groove, and being each capable of engaging either the rotary protrusion piece (74) or the locking protrusion piece (75). If one of the two engagement portions (63b, 63c) engages the rotary protrusion piece (74), the one of the two engagement portions (63b, 63c) may serve as the rotation supporter, and if the one of the two engagement portions (63b, 63c) engages the locking protrusion piece (75), the one of the two engagement portions (63b, 63c) may serve as the rotation stopper. The two engagement members (63, 63) may have an identical shape.

When a specific portion of each of the engagement members (63) serves as the rotation supporter, and another specific portion thereof serves as the rotation stopper, the engagement members (63) each placed on a corresponding one of one end and the other end of the heat transfer member (62) in the longitudinal direction of the groove cannot be formed in the same shape. In other words, if the two engagement members (63) are formed in the same shape, one of the engagement members (63) can be placed on the one end of the heat transfer member (62) in the longitudinal direction of the groove (61) such that the rotation supporter is provided on one side of the heat transfer member (62) in the width direction of the groove (61) and the rotation stopper is provided on the other side thereof remote from the rotation supporter, whereas the other one of the supporting members (63) cannot be placed on the other end of the heat transfer member (62) in the longitudinal direction of the groove (61) such that the rotation supporter is provided on the one side of the heat transfer plate (62) in the width direction of the groove (61) and the rotation stopper is provided on the other side thereof remote from the rotation supporter.

In contrast, in the sixth aspect of the invention, the two engagement members (63, 63) each include the two engagement portions (63b, 63c). The two engagement portions (63b, 63c) are each provided on a corresponding one of first and second end portions of the heat transfer member (62) to each function as either the rotation supporter or the rotation stopper. For this reason, even if the two engagement members (63, 63) are formed in the same shape, one of the engagement portions (63b, 63c) of each engagement member (63) is provided on one side of the heat transfer member (62) in the width direction of the groove, and serves as the rotation supporter, and the other one of the engagement portions (63b, 63c) remote from the rotation supporter serves as the rotation stopper. In other words, even if the two engagement members (63, 63) are formed in the same shape, the engagement members (63) can be each placed on a corresponding one of the one end and the other end of the heat transfer member (62) in the longitudinal direction of the groove (61) such that the rotation supporter is provided on one side of the heat transfer plate (62) in the width direction of the groove and the rotation stopper is provided on the other side thereof remote from the rotation supporter.

According to a seventh aspect of the invention, in the cooler of any one of the first through sixth aspects of the invention, thermally conductive grease (79) may be applied to a laterally central portion of the groove (61) to extend along a length of the groove.

In the seventh aspect of the invention, the thermally conductive grease (79) is applied to the laterally central portion of the groove (61) to extend along the length of the groove. If the thermally conductive grease (79) is applied as above, only fitting the refrigerant pipe (15) into the groove (61) allows the thermally conductive grease (79) applied to the laterally central portion of the groove (61) to be thinly spread and to extend toward both lateral ends of the groove (61). A gap between the refrigerant pipe (15) and the inner surface of the groove (61) of the heat transfer plate (62) is filled with the thermally conductive grease (79) to reduce the contact thermal resistance.

An electrical component unit according to an eighth aspect of the invention includes: a substrate (51) on which a heat generating component (53) is placed; and the cooler (60) of any one of the first through seventh aspects of the invention placed on the heat generating component (53).

In the eighth aspect of the invention, the cooler (60) is placed on the heat generating component (53) placed on the substrate (51), and forms a portion of the electrical component unit.

A refrigeration apparatus according to a ninth aspect of the invention including a refrigerant circuit (10) through which refrigerant circulates to perform a vapor compression refrigeration cycle includes: the electrical component unit (50) of the eighth aspect of the invention. A liquid pipe (15) of the refrigerant circuit (10) is fitted into the groove (61) of the cooler (60) of the electrical component unit (50).

In the ninth aspect of the invention, the heat generating component (53) on which the cooler (60) is placed is cooled with liquid refrigerant through the refrigerant circuit (10).

Advantages of the Invention

According to the first aspect of the invention, the opening/closing mechanism (77) through which the presser plate (64) is rotatably attached to the heat transfer member (62) is provided such that the presser plate (64) is switched between an open position at which the groove (61) is exposed and a closed position at which the presser plate (64) covers the groove (61). For this reason, when the cooler (60) including the heat transfer member (62) having the groove (61) coated with the thermally conductive grease (79) is transported to the site of installation of the cooler (60), the presser plate (64) is closed to protect the thermally conductive grease (79), thereby preventing the removal of the thermally conductive grease (79) arising from the drying thereof or contact therewith. In other words, the cooler (60) can be transported to the site of installation of the cooler (60) with the thermally conductive grease (79) protected without increasing cost due to the provision of a cover separate from the components of the cooler (60). Also at the site of installation, after the presser plate (64) is opened, and the refrigerant pipe (15) is fitted into the groove (61) of the heat transfer member (62), the presser plate (64) is rotated so as to be closed. This allows the presser plate (64) to be easily fixed to the heat transfer member (62) without supporting the presser plate (64) with a hand. In view of the foregoing, according to the present invention, the placement of the refrigerant pipe (15) on the cooler (60) can be facilitated, and a cover having been conventionally used can be omitted to reduce cost.

According to the second aspect of the invention, the lock mechanism (78) is provided to prevent the rotation of the presser plate (64) and keep the presser plate (64) closed. For this reason, when the cooler (60) is transported to the site of installation of the cooler (60), the presser plate (64) can be kept closed by the lock mechanism (78). This can ensure the protection of the thermally conductive grease (79). At the site of installation, after the refrigerant pipe (15) is fitted into the groove (61) of the heat transfer member (62), the presser plate (64) is kept closed by the lock mechanism (78), and the presser plate (64) can be thus fixed to the heat transfer member (62) without pressing the presser plate (64) with the hand. This can facilitate fixing the presser plate (64), and facilitate placing the refrigerant pipe (15) on the cooler (60).

According to the third aspect of the invention, the opening/closing mechanism (77) includes the rotary protrusion piece (74) and the rotation supporter. The rotary protrusion piece (74) protrudes from an end portion of the presser plate (64) near the axis of rotation of the presser plate (64). The rotation supporter is provided on one side of the heat transfer member (62) located in the width direction of the groove to rotatably support the rotary protrusion pieces (74). For this reason, the opening/closing mechanism (77) can have a simple configuration.

According to the fourth aspect of the invention, the lock mechanism (78) includes the locking protrusion piece (75) and the rotation stopper. The locking protrusion piece (75) protrudes from an end portion of the presser plate (64) remote from the axis of rotation of the presser plate (64). The rotation stopper is provided on a side of the heat transfer member (62) remote from the rotation supporter in the width direction of the groove. When the closed presser plate (64) is slid, the rotation stopper engages the locking protrusion piece (75) to prevent the rotation of the presser plate (64). Thus, the lock mechanism (78) can have a simple configuration. An easy operation in which the presser plate (64) is merely slid prevents the rotation of the presser plate (64), and the presser plate (64) can be kept closed.

According to the fifth aspect of the invention, the engagement member (63) having the rotation supporter and the rotation stopper is placed on the heat transfer member (62). For this reason, the heat transfer member (62) can be easily provided with the rotation supporter and the rotation stopper only by placing the engagement member (63) on the heat transfer member (62) that does not include the rotation supporter and the rotation stopper.

According to the sixth aspect of the invention, the two engagement members (63, 63) each include the engagement portions (63b, 63c). The two engagement portions (63b, 63c) are each provided on a corresponding one of both sides of the heat transfer plate (62) in the width direction of the groove (61) to each function as either the rotation supporter or the rotation stopper. For this reason, even if the two engagement members (63, 63) are formed in the same shape, the engagement members (63) can be each placed on a corresponding one of the one end and the other end of the heat transfer member (62) in the longitudinal direction of the groove (61) such that the rotation supporter is provided on one side of the heat transfer plate (62) in the width direction of the groove (61) and the rotation stopper is provided on the other side thereof remote from the rotation supporter. For this reason, even if one of the two engagement members (63, 63) is placed on either of two portions of the heat transfer member (62) on which the engagement members (63) are to be placed, the opening/closing mechanism (77) and the lock mechanism (78) can be formed. This prevents the two engagement members (63, 63) from being placed on the heat transfer member (62) by mistake. Furthermore, the need for forming two types of the engagement members (63) is eliminated, thereby reducing the degree of increase in cost for manufacturing the engagement members (63, 63).

According to the seventh aspect of the invention, the thermally conductive grease (79) is applied to the laterally central portion of the groove (61) of the heat transfer plate (62) to extend along the length of the groove (61). When the refrigerant pipe (15) is placed on the cooler (60), only fitting the refrigerant pipe (15) into the groove (61) allows the thermally conductive grease (79) to be thinly and widely spread. In other words, the thermally conductive grease (79) does not need to be spread using a roller or any other tool, and both the application of the thermally conductive grease (79) to the groove (61) and the placement of the refrigerant pipe (15) on the cooler (60) can be facilitated.

According to the ninth aspect of the invention, the refrigerant pipe (15) of the refrigerant circuit (10) is fitted into the groove (61) of the heat transfer plate (62) of the cooler (60), and the heat generating component (53) can be thus fully cooled by liquid refrigerant through the refrigerant circuit (10).

BRIEF DESCRIPTION OF THE DRAWINGS

FIGS. 6(A) and 6(B) illustrate a heat transfer plate according to the embodiment, in which FIG. 6(A) is a front view of the heat transfer plate, and FIG. 6(B) is a bottom view thereof.

FIGS. 7(A)-7(D) illustrate a supporting member according to the embodiment, in which FIG. 7(A) is a front view of the supporting member, FIG. 7(B) is a bottom view thereof, FIG. 7(C) is a left side view thereof, and FIG. 7(D) is a right side view thereof.

FIGS. 8(A)-8(D) illustrate a presser plate according to the embodiment, in which FIG. 8(A) is a front view of the presser plate, FIG. 8(B) is a bottom view thereof, FIG. 8(C) is a left side view thereof, and FIG. 8(D) is a right side view thereof.

DESCRIPTION OF EMBODIMENTS

Figure 1:
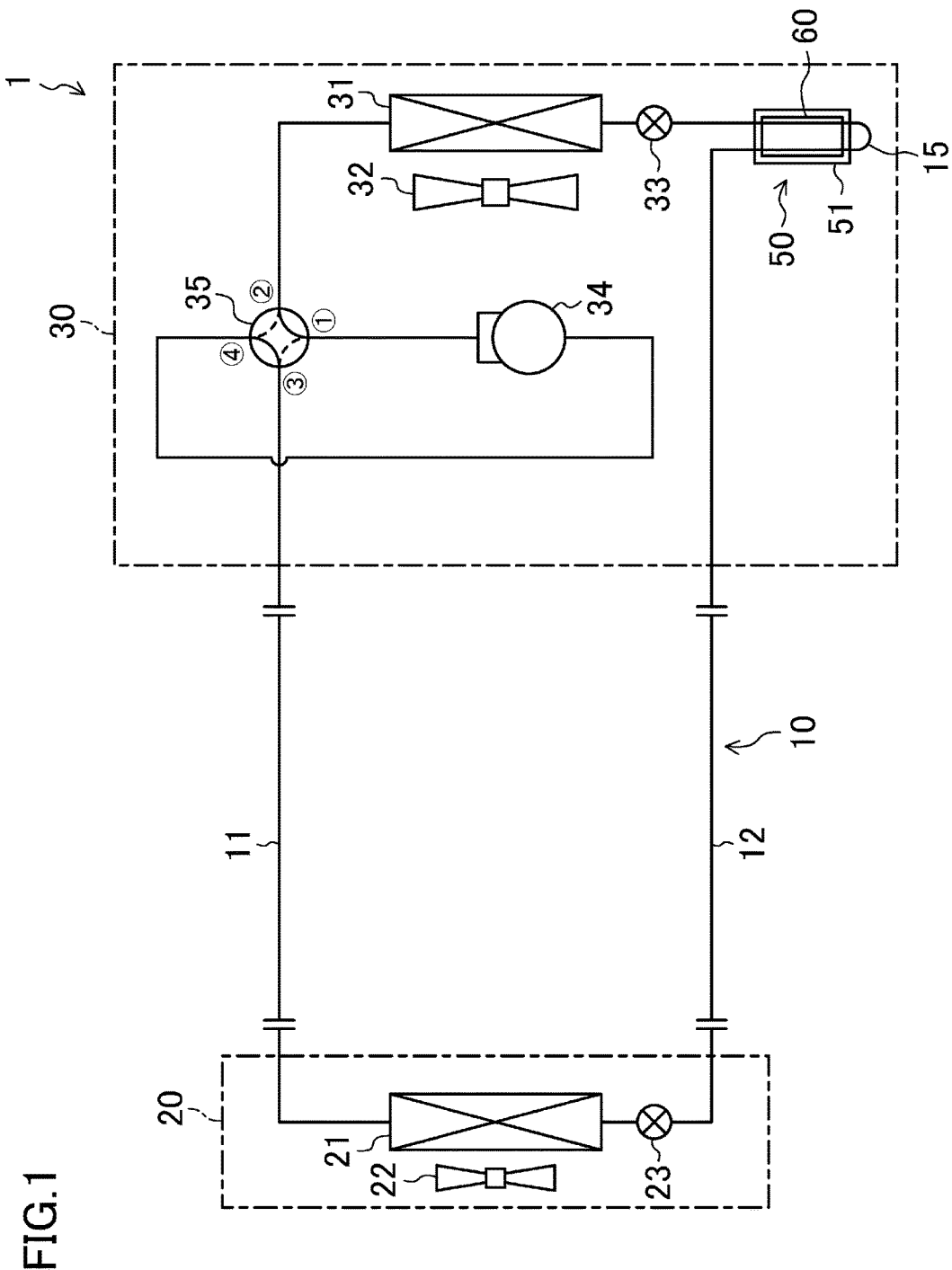
FIG. 1 is a refrigerant circuit diagram illustrating a schematic configuration of an air conditioner according to an embodiment of the present invention.

A cooler, an electrical component unit, and a refrigeration apparatus according to an embodiment of the present invention will now be described with reference to the drawings. An air conditioner will now be described as an example refrigeration apparatus according to the present invention.

The refrigeration apparatus according to the present invention should not be limited to the air conditioner.

Embodiment of the Invention

An air conditioner (1) includes a refrigerant circuit (10) through which refrigerant circulates to perform a vapor compression refrigeration cycle, and the air conditioner (1) selects one of a cooling operation and a heating operation to perform the one of the operations. Specifically, the air conditioner (1) includes an indoor unit (20) placed indoors, and an outdoor unit (30) placed outdoors. The indoor unit (20) and the outdoor unit (30) are connected together through two connecting pipes (11, 12) to form the refrigerant circuit (10) serving as a closed circuit.

<Indoor Unit>

The indoor unit (20) includes an indoor heat exchanger (21), an indoor fan (22), and an indoor expansion valve (23). The indoor heat exchanger (21) is, for example, a cross-fin-type fin-and-tube heat exchanger, and air is delivered to the indoor heat exchanger (21) by the indoor fan (22). In the indoor heat exchanger (21), heat is exchanged between refrigerant flowing through the interior of a heat transfer tube and air passing outside the heat transfer tube. The indoor expansion valve (23) is, for example, an electronic expansion valve.

<Outdoor Unit>

The outdoor unit (30) includes an outdoor heat exchanger (31), an outdoor fan (32), an outdoor expansion valve (33), a compressor (34), and a four-way valve (35). The outdoor heat exchanger (31) is, for example, a cross-fin-type fin-and-tube heat exchanger, and air is delivered to the outdoor heat exchanger (31) by the outdoor fan (32). In the outdoor heat exchanger (31), heat is exchanged between refrigerant flowing through the interior of a heat transfer tube and air passing outside the heat transfer tube. The outdoor expansion valve (33) is, for example, an electronic expansion valve. The compressor (34) is, for example, a rotary compressor, such as a scroll compressor. The four-way valve (35) has four ports, i.e., first through fourth ports, and changes the direction of circulation of refrigerant through the refrigerant circuit (10). In the cooling operation, the four-way valve (35) allows the first and third ports to communicate with the second and fourth ports, respectively (the state illustrated by the solid line in FIG. 1), and in the heating operation, the four-way valve (35) allows the first and second ports to communicate with the third and fourth ports, respectively (the state illustrated by the broken line in FIG. 1).

A specific configuration of the outdoor unit (30) will now be described in detail. For convenience of explanation, the lower side of FIG. 2 is hereinafter referred to as the "front side," the upper side of FIG. 2 is hereinafter referred to as the "back side," the left-hand side of FIG. 2 is hereinafter referred to as the "left-hand side," the right-hand side of FIG. 2 is hereinafter referred to as the "right-hand side," the front side of FIG. 2 in a direction orthogonal to the paper is hereinafter referred to as the "upper side," and the back side of FIG. 2 in the direction orthogonal to the paper is hereinafter referred to as the "lower side."

Figure 2:
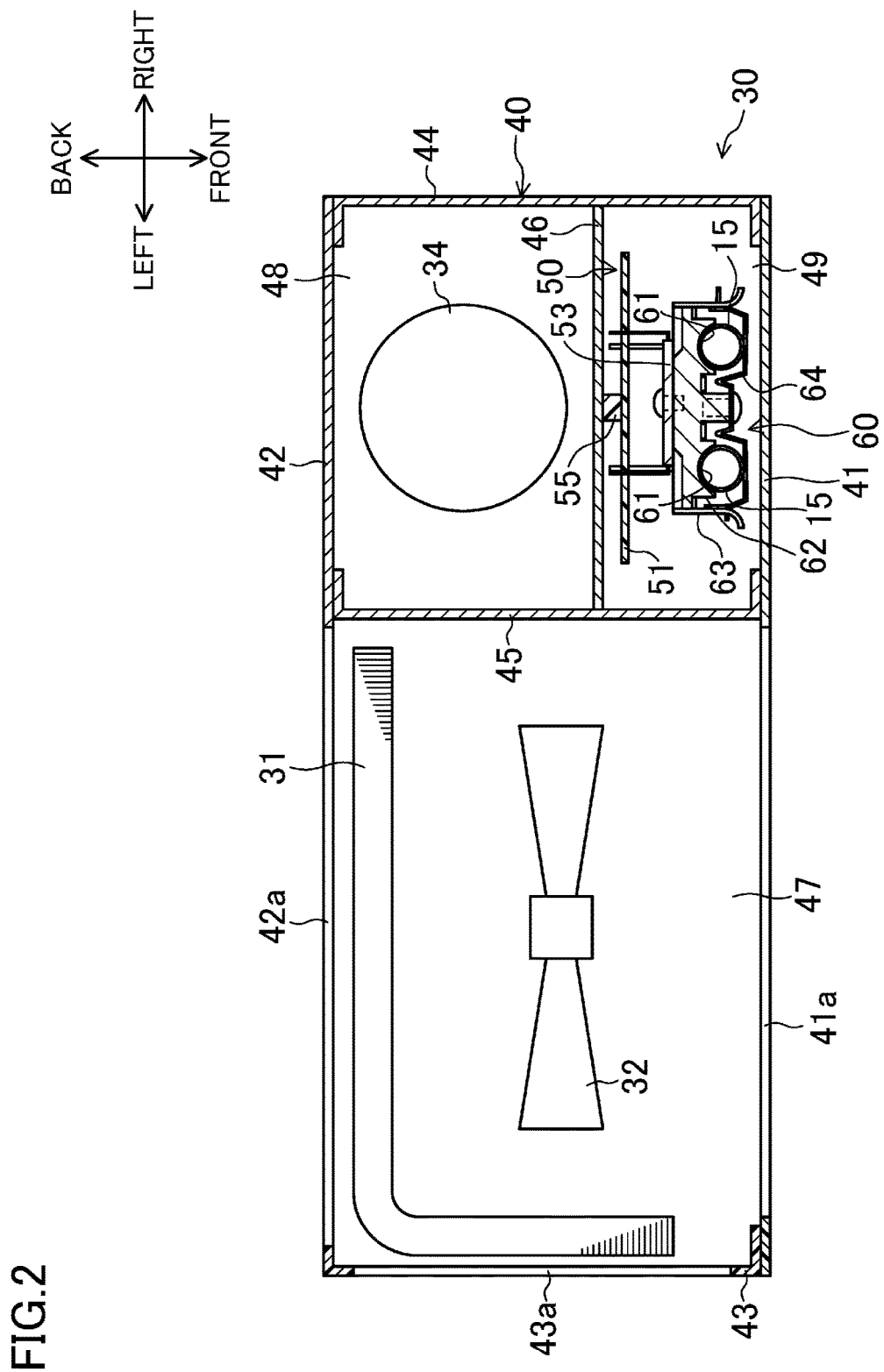
FIG. 2 is a plan view of an outdoor unit according to the embodiment.

As illustrated in FIG. 2, the outdoor unit (30) includes a box-like casing (40). The casing (40) includes a front panel (41), a back panel (42), a left side panel (43), and a right side panel (44). A front portion of the outdoor unit (30) includes the front panel (41). The front panel (41) has an outlet (41a) through which outdoor air is ejected. The front panel (41) is detachably attached to a body of the casing (40). A back portion of the outdoor unit (30) includes the back panel (42).

The back panel (42) has an inlet (42a) through which outdoor air is sucked. A left portion of the outdoor unit (30) includes the left side panel (43). The left side panel (43) has an inlet (43a). A right portion of the outdoor unit (30) includes the right side panel (44).

The casing (40) includes a front-to-back partition (45) and a transverse partition (46). The interior space of the casing (40) is partitioned into two left and right spaces by the front-to-back partition (45). Among the two laterally aligned spaces, the left space forms a heat exchanger chamber (47), and the right space is further partitioned into two front and back spaces by the transverse partition (46). Among the two front and back aligned spaces, the back space forms a compressor chamber (48), and the front space forms an electrical component chamber (49).

<Components in Electrical Component Chamber>

An electrical component unit (50) and a cooling pipe (15) are housed in the electrical component chamber (49). The electrical component unit (50) includes various electrical components for controlling various components of the air conditioner (1). Refrigerant in the refrigerant circuit (10) flows through the cooling pipe (15).

As illustrated in FIG. 2, the electrical component unit (50) includes a printed circuit board (51) and a cooler (60). The printed circuit board (51) is populated with various electronic components including a power module (53) that is a heat generating component. The cooler (60) is configured to cool the power module (53) mounted on the printed circuit board (51). The power module (53) is, for example, a switching element of an inverter circuit, and is cooled by the cooler (60) to prevent the temperature of the power module (53) generating heat during operation from exceeding a maximum temperature at which the power module (53) is operable (e.g., 90° C.). The cooler (60) is attached to the printed circuit board (51). The electrical component unit (50) includes the printed circuit board (51) having a front surface to which the power module (53) and the cooler (60) are attached, and is fixed through a fixing member (55) to the transverse partition (46). The detailed configuration of the cooler (60) will be described below.

Figure 3:
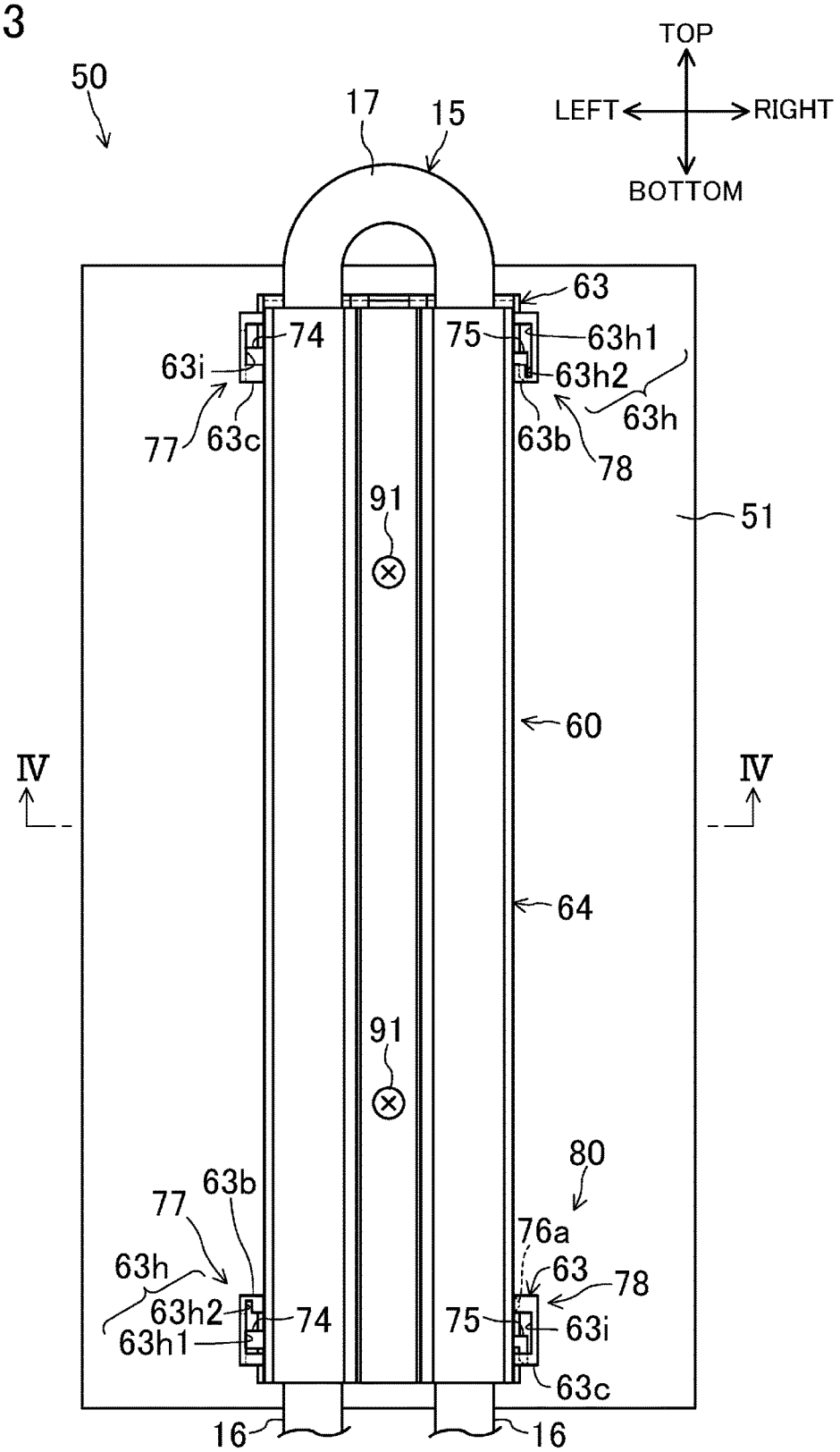
FIG. 3 is a front view of an electrical component unit according to the embodiment.

As illustrated in FIG. 1, the cooling pipe (15) forms a portion of a refrigerant pipe of the refrigerant circuit (10). Specifically, in this embodiment, the cooling pipe (15) is connected between the indoor expansion valve (23) and the outdoor expansion valve (33) of the refrigerant circuit (10), and forms a portion of a liquid pipe. In other words, high-pressure liquid refrigerant obtained by condensing refrigerant in the indoor heat exchanger (21) or the outdoor heat exchanger (31) flows through the cooling pipe (15). As illustrated in FIG. 3, in this embodiment, the cooling pipe (15) is a U-shaped pipe, and includes two straight pipe portions (16, 16), and a U-shaped bent pipe portion (17) connecting ends of the two straight pipe portions (16, 16) together. The two straight pipe portions (16, 16) are generally parallel to each other. The cooling pipe (15) is disposed in the electrical component chamber (49) such that the bent pipe portion (17) is above the two straight pipe portions (16, 16), i.e., so as to be in the shape of an inverted U as viewed from the front. The cooling pipe (15) is previously disposed in the electrical component chamber (49) of the casing (40) before the placement of the electrical component unit (50) therein. Furthermore, before the placement of the electrical component unit (50), the cooling pipe (15) is inclined forward such that the top of the cooling pipe (15) is located forward of the bottom thereof, and after the electrical component unit (50) is placed behind the cooling pipe (15), the cooling pipe (15) is returned to its original upright position (see FIG. 2) under elastic force.

<Cooler>

Figure 4:
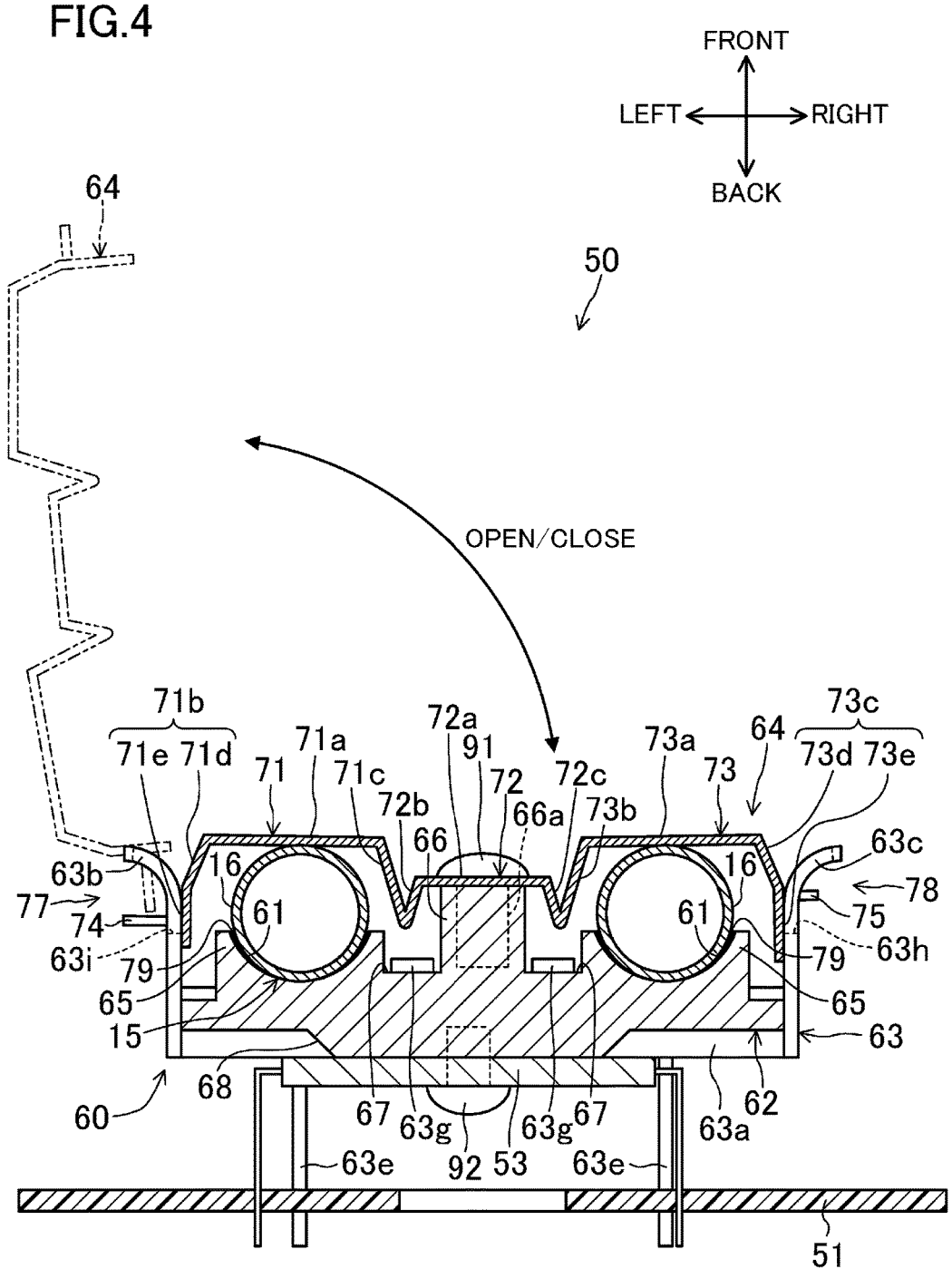
FIG. 4 is a cross-sectional view taken along the line IV-IV in FIG. 3.

As illustrated in FIG. 4, the cooler (60) includes a heat transfer plate (62), two supporting members (engagement members) (63, 63), and a presser plate (64). The heat transfer plate (62) has grooves (61) into which the cooling pipe (15) is fitted. The two supporting members (63, 63) are used to attach the heat transfer plate (62) to the printed circuit board (51). The presser plate (64) is configured to press the cooling pipe (15) against the heat transfer plate (62).

Figure 5:
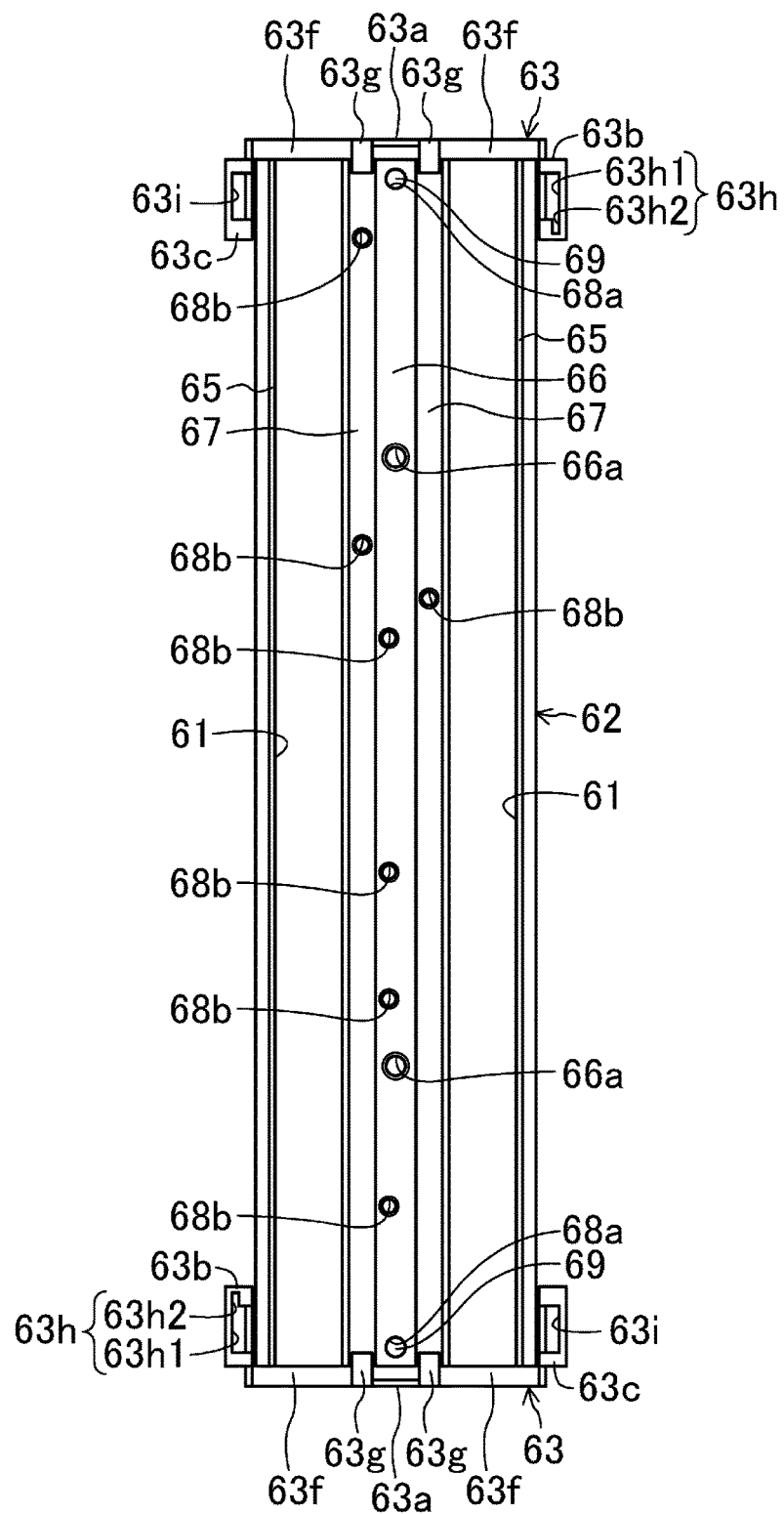
FIG. 5 is a front view of a cooler from which a presser plate is removed according to the embodiment.
Figure 6A:
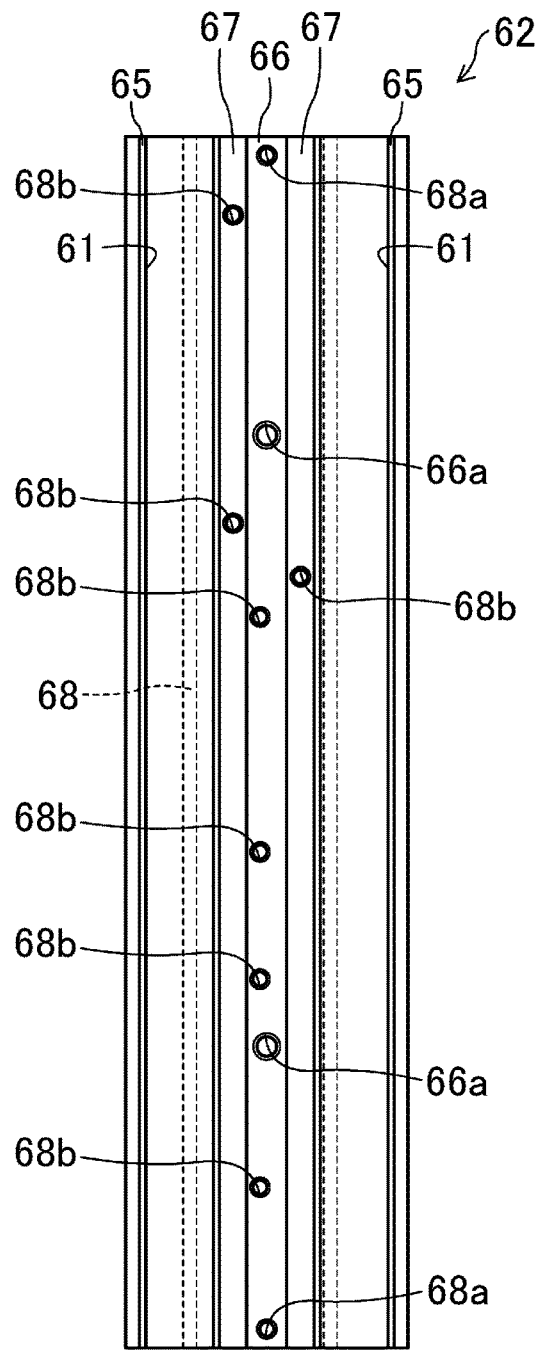
Figure 6B:
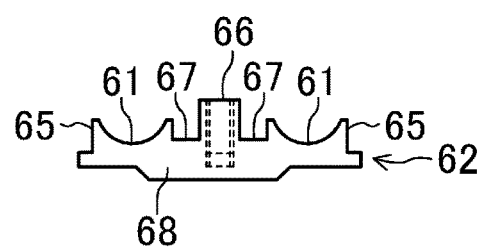

As illustrated in FIGS. 5, 6(A), and 6(B), the heat transfer plate (62) is made of a metal material having high thermal conductivity, such as aluminum, and is a long plate. A front surface (an upper surface in FIG. 6(B)) of the heat transfer plate (62) has three protrusions (65, 66, 65) extending from one longitudinal end of the heat transfer plate (62) to the other longitudinal end thereof, and a recess (67, 67) is formed between each adjacent pair of the three protrusions (65, 66, 65). Among the three protrusions (65, 66, 65), the outer protrusions (65, 65) are wider than the inner protrusion (66), and the height of each outer protrusion (65, 65) is lower than that of the inner protrusion (66).

The two outer protrusions (65, 65) each have the groove (61) into which one of the two straight pipe portions (16, 16) of the above-described cooling pipe (15) is fitted. The grooves (61) extend along the length of the heat transfer plate (62), and each have a cross-sectional shape such that one of the two straight pipe portions (16, 16) of the cooling pipe (15) is fitted into the groove (61). Thermally conductive grease (79) is interposed between the cooling pipe (15) and each groove (61) (see FIG. 4). A small gap between the cooling pipe (15) and the groove (61) is filled with the thermally conductive grease (79) to reduce the contact thermal resistance between the cooling pipe (15) and the inner surface of the groove (61) of the heat transfer plate (62) and facilitate transferring heat between the cooling pipe (15) and the heat transfer plate (62).

A top portion of the inner protrusion (66) is flat, and is in contact with a top portion (72a) of a second protrusion (72) of the presser plate (64) described below (see FIG. 4). The inner protrusion (66) has two screw holes (66a) into each of which a screw (91) for fixing the presser plate (64) is screwed. One of the two screw holes (66a) is spaced apart from one longitudinal end of the inner protrusion (66) toward the other longitudinal end by one-fourth of the length of the inner protrusion (66), and the other one thereof is spaced apart from one longitudinal end of the inner protrusion (66) toward the other longitudinal end by three-fourth of the length of the inner protrusion (66).

The two recesses (67) each have a flat bottom surface linearly extending from one longitudinal end of the heat transfer plate (62) to the other longitudinal end thereof. The bottom surface of each recesses (67) are in contact with corresponding ones of nail portions (63g) of the supporting members (63, 63) described below (see FIG. 4).

A back surface of the long heat transfer plate (62) includes a wide protrusion (68) extending from one longitudinal end of the heat transfer plate (62) to the other longitudinal end thereof. The protrusion (68) has a flat top portion, and longitudinal end portions through each of which a screw hole (68a) passes. Screws (69) described below are screwed into the screw holes (68a) to fix the supporting members (63) (see FIGS. 5 and 10). The protrusion (68) has a plurality of (in this embodiment, seven) screw holes (68b). Screws (92) are each screwed into one of the screw holes (68b) to fix the power module (53). The screw holes (68b) pass through the heat transfer plate (62) from the front of the heat transfer plate (62) to the rear thereof. Some of the screw holes (68b) extend from the top portion of the back protrusion (68) to the top portion of the front inner protrusion (66), and the other ones of the screw holes (68b) each extend from the top portion of the back protrusion (68) to the bottom surface of a corresponding one of the recesses (67) in the front surface of the heat transfer plate (62). The screws (92) are screwed into the screw holes (68b) with a heat dissipation surface of the power module (53) being in contact with the flat top portion of the protrusion (68), thereby placing the power module (53) on the heat transfer plate (62) such that the power module (53) is in thermal contact with the heat transfer plate (62).

As illustrated in FIGS. 5 and 7(A)-7(D), the two supporting members (63) are obtained by bending a tinned metal plate, and are formed in the same shape. Specifically, the supporting members (63) each include a body portion (63a), two curved portions (engagement portion) (63b, 63c), a bottom portion (63d), two supporting portions (63e, 63e), two bent portions (63f, 63o), and two nail portions (63g, 63g). Since the two supporting members (63) are formed in the same shape, the configuration of only a lower one of the supporting members (63) in FIG. 5 will be described in detail with reference to FIGS. 7(A)-7(D).

As illustrated in FIGS. 7(A) and 7(B), the body portion (63a) is a metal piece formed in a U-shape. Specifically, the body portion (63a) has a main body and two side portions. The main body extends along a (upper or lower) longitudinal end surface of the heat transfer plate (62), i.e., along the groove width (along a lateral direction). The two side portions are bent from both ends of the main body along the heat transfer plate (62), and extend along both side surfaces of the heat transfer plate (62).

As illustrated in FIGS. 7(C) and 7(D), the two curved portions (63b, 63c) are each continuous with a corresponding one of the two side portions of the body portion (63a), and each extend along a corresponding one of the side surfaces of the heat transfer plate (62). The length of each of the two curved portions (63b, 63c) in a front-to-rear direction (in a top-to-bottom direction in FIGS. 7(B)-7(D)) is greater than that of a corresponding one of the two side portions of the body portion (63a), and a front end portion of each curved portion (63b, 63c) is located forwardly of the front end of the heat transfer plate (62) (see FIG. 4). The curved portions (63b, 63c) are curved such that with decreasing distance to the front end of each curved portion (63b, 63c), the distance from the heat transfer plate (62) increases.

As illustrated in FIG. 7(C), the front end portion (upper end portion in FIG. 7(C)) of one of the two curved portions (63b, 63c), i.e., a first curved portion (63b), has a first hole (63h). The first hole (63h) includes a rectangular main hole portion (63h1), and a slender hole portion (63h2) extending upwardly (leftwardly in FIG. 7(C)) from a front end portion of the main hole portion (63h1). In contrast, as illustrated in FIG. 7(D), the front end portion (upper end portion in FIG. 7(D)) of the other one of the two curved portions (63b, 63c), i.e., a second curved portion (63c), has a rectangular second hole (63i). A region of the second curved portion (63c) behind the second hole (63i) (below the second hole (63i) in FIG. 7(D)) has a rectangular third hole (63k) that is smaller than the second hole (63i). The location of the second hole (63i) corresponds to that of the first hole (63h).

Although described below in deital, T-shaped protrusion pieces (74) and L-shaped protrusion pieces (75) of the presser plate (64) can be each inserted into either the second hole (63i) or the first hole (63h). Either the first curved portion (63b) or the second curved portion (63c) engaging a corresponding one of the T-shaped protrusion pieces (74) forms an engagement portion functioning as a rotation supporter rotatably supporting the corresponding one of the T-shaped protrusion pieces (74), and either the first curved portion (63b) or the second curved portion (63c) engaging a corresponding one of the L-shaped protrusion pieces (75) forms an engagement portion functioning as a rotation stopper stopping the rotation of the presser plate (64).

As illustrated in FIGS. 7(A) and 7(B), the bottom portion (63d) extends from the back end (lower end in FIG. 7(B)) of the main body of the body portion (63a) toward the heat transfer plate (62), and is formed along the back surface of the heat transfer plate (62). A central portion of the bottom portion (63d) has an insertion hole (631) through which one of the screws (69) is inserted.

As illustrated in FIGS. 7(B)-7(D), the two supporting portions (63e, 63e) extend backwardly (downwardly in FIG. 7(B)) from both lateral ends of the bottom portion (63d). The two supporting portions (63e, 63e) are each formed in a generally rectangular shape, and each have a distal end portion (lower end portion in FIG. 7(B)) that branches into two long slender nails. Although described below in detail, the nails of the two supporting portions (63e, 63e) are inserted into through-holes formed in the printed circuit board (51) to temporarily fix the cooler (60) to the printed circuit board (51).

The bent portions (63f) extend from both end portions of the main body of the body portion (63a) toward a corresponding one of longitudinal end surfaces (upper and lower end surfaces) of the heat transfer plate (62).

The two nail portions (63g, 63g) are located inwardly of the two bent portions (63f, 63f) to extend from the main body of the body portion (63a) toward the heat transfer plate (62), and are formed along the flat bottom surfaces of the two recesses (67, 67) of the heat transfer plate (62) (see FIG. 4).

With such a configuration, while the heat transfer plate (62) is sandwiched between the two nail portions (63g, 63g) and the bottom portion (63d) of each of the two supporting members (63), the supporting member (63) is fixed to the heat transfer plate (62) by inserting one of the screws (69) through the insertion hole (631) of the bottom portion (63d) and screwing the one of the screws (69) into a corresponding one of the screw holes (68a) of the heat transfer plate (62). When, as such, the two supporting members (63) are placed on both end portions of the heat transfer plate (62) in a longitudinal direction of the groove, the second curved portion (63c) of the upper supporting member (63) and the first curved portion (63b) of the lower supporting member (63) are respectively placed to the left of upper and lower end portions of the heat transfer plate (62), and the first curved portion (63b) of the upper supporting member (63) and the second curved portion (63c) of the lower supporting member (63) are respectively placed to the right of upper and lower end portions of the heat transfer plate (62) as illustrated in FIG. 5. The two supporting members (63) are formed in the same shape, and even when the locations at which the two supporting members (63) are placed on the heat transfer plate (62) are replaced with each other, the positions in which the supporting members (63) are placed are, therefore, identical.

As illustrated in FIGS. 8(A)-8(D), the presser plate (64) is obtained by bending a rectangular zinc-plated metal plate. As illustrated in FIG. 4, the presser plate (64) is placed in front of the heat transfer plate (62), and is attached to the heat transfer plate (62) through a hinge mechanism (77) described below such that the presser plate (64) can open or close. The presser plate (64) has a shape generally identical to the outer shape of the heat transfer plate (62), and when closed, the presser plate (64) faces the heat transfer plate (62) to cover the two grooves (61, 61). The presser plate (64) is kept closed by a lock mechanism (78) described below.

Specifically, as illustrated in FIGS. 8(A)-8(D), the presser plate (64) includes three protrusions (71, 72, 73). The three protrusions (71, 72, 73) are formed by bending the rectangular metal plate, and extend from one longitudinal end of the presser plate (64) to the other longitudinal end thereof. Among the three protrusions (71, 72, 73), a left first protrusion (71) and a right third protrusion (73) are wider than a central second protrusion (72), and the height of each of the first protrusion (71) and the third protrusion (73) is higher than that of the second protrusion (72). The three protrusions (71, 72, 73) each have a top portion (71a, 72a, 73a), a left side portion (71b, 72b, 73b) continuous with the left end of the top portion (71a, 72a, 73a), and a right side portion (71c, 72c, 73c) continuous with the right end of the top portion (71a, 72a, 73a). In the presser plate (64), the right side portion (71c) of the first protrusion (71) is continuous with the left side portion (72b) of the second protrusion (72), and the right side portion (72c) of the second protrusion (72) is continuous with the left side portion (73b) of the third protrusion (73).

The second protrusion (72) has a generally trapezoidal cross-sectional shape defined by the top portion (72a), the left side portion (72b), and the right side portion (72c). The top portion (72a) of the second protrusion (72) has two insertion holes (72d) through each of which a screw (91) is inserted to fix the presser plate (64) to the heat transfer plate (62). One of the two insertion holes (72d) is apart from one longitudinal end of the second protrusion (72) toward the other longitudinal end by one-fourth of the length of the second protrusion (72), and the other one of the two insertion holes (72d) is apart from the one longitudinal end of the second protrusion (72) toward the other longitudinal end by three-fourth of the length of the second protrusion (72). The two insertion holes (72d) correspond to the two screw holes (66a) of the inner protrusion (66) of the heat transfer plate (62).

In contrast, the first protrusion (71) and the third protrusion (73) are substantial mirror images of each other with respect to the second protrusion (72). Specifically, the right side portion (71c) of the first protrusion (71) and the left side portion (73b) of the third protrusion (73) are mirror images of each other, the top portion (71a) of the first protrusion (71) and the top portion (73a) of the third protrusion (73) are mirror images of each other, and the left side portion (71b) of the first protrusion (71) and the right side portion (73c) of the third protrusion (73) are mirror images of each other.

The right side portion (71c) of the first protrusion (71) extends so that the right side portion (71c) and the left side portion (72b) of the second protrusion (72) continuous with the right side portion (71c) form a V-shape. In contrast, the left side portion (73b) of the third protrusion (73) extends so that the left side portion (73b) and the right side portion (72c) of the second protrusion (72) continuous with the left side portion (73b) form a V-shape.

The top portion (71a) of the first protrusion (71) is inclined backward (downward in FIG. 8(B)) toward the left lateral end of the top portion (71a). In contrast, the top portion (73a) of the third protrusion (73) is inclined backward toward the right lateral end of the top portion (73a).

The left side portion (71b) of the first protrusion (71) includes an inclined portion (71d) and an uninclined portion (71*e*). The inclined portion (71*d*) is continuous with the top portion (71*a*), and is inclined leftward toward the back (lower in FIG. 8(B)) end of the inclined portion (71*d*). The uninclined portion (71*e*) is continuous with the inclined portion (71*d*), and extends backwardly in a straight line. In contrast, the right side portion (73*c*) of the third protrusion (73) includes an inclined portion (73*d*) and an uninclined portion (73*e*). The inclined portion (73*d*) is continuous with the top portion (73*a*), and is inclined rightward toward the back end of the inclined portion (73*d*). The uninclined portion (73*e*) is continuous with the inclined portion (73*d*), and extends backwardly in a straight line.

Both vertical end portions of the left side portion (71*b*) of the first protrusion (71) are each provided with a T-shaped protrusion piece (74) protruding leftward. To form the two protrusion pieces (74, 74), T-shaped pieces are separated from the left side portion (71*b*) such that only one end portion of each T-shaped piece is connected to the left side portion (71*b*), and the other portion of the T-shaped piece is bent by being turned leftward about the one end portion of the T-shaped piece. The two protrusion pieces (74, 74) each include a protruding portion (74*a*) and an extension portion (74*b*). The protruding portion (74*a*) protrudes leftward from the left side portion (71*b*), and the extension portion (74*b*) vertically extends from the distal end of the protruding portion (74*a*). The vertical length of the extension portion (74*b*) of each protrusion piece (74, 74) is greater than that of each of the main hole portion (63*h*1) of the first hole (63*h*) of a corresponding one of the supporting members (63) and the second hole (63*i*) of the corresponding one of the supporting members (63), and is less than that of a front end portion of the first hole (63*h*) (including a front end portion of the main hole portion (63*h*1) and the slender hole portion (63*h*2)). Although described below in detail, the two protrusion pieces (74, 74) each form a rotary protrusion piece of the hinge mechanism (opening/closing mechanism) (77). The hinge mechanism (77) rotatably attaches the presser plate (64) to the heat transfer plate (62) such that the presser plate (64) is switched between an open position and a closed position.

In contrast, both vertical end portions of the right side portion (73*c*) of the third protrusion (73) are each provided with an L-shaped protrusion piece (75) protruding rightward. To form the two protrusion pieces (75, 75), L-shaped pieces are separated from the right side portion (73*c*) such that only one end portion of each L-shaped piece is connected to the right side portion (73*c*), and the other portion of the L-shaped piece is bent by being turned rightward about the one end portion of the L-shaped piece. The two protrusion pieces (75, 75) each include a protruding portion (75*a*) and an extension portion (75*b*). The protruding portion (75*a*) protrudes rightward from the right side portion (73*c*). The extension portion (75*b*) extends downward from the distal end of the protruding portion (75*a*). The vertical length of the extension portion (75*b*) of each protrusion piece (75, 75) is less than that of each of the main hole portion (63*h*1) of the first hole (63*h*) of a corresponding one of the supporting members (63) and the second hole (63*i*) of the corresponding one of the supporting members (63). The locations of the two protrusion pieces (75, 75) correspond to those of the two T-shaped protrusion pieces (74, 74). Although described below in detail, the two protrusion pieces (75, 75) each form a locking protrusion piece of the lock mechanism (78). The lock mechanism (78) stops the rotation of the presser plate (64) to keep the presser plate (64) closed.

The uninclined portion (73*e*) of the right side portion (73*c*) of the third protrusion (73) has a leaf spring portion (76) in the vicinity of a lower one of the protrusion pieces (75, 75). A portion of the uninclined portion (73*e*) of the right side portion (73*c*) of the third protrusion (73) is separated into a vertically extending strip to form the leaf spring portion (76). Only an upper end portion of the leaf spring portion (76) is continuous with the uninclined portion (73*e*), and the other portion of the leaf spring portion (76) is separated from the uninclined portion (73*e*). The leaf spring portion (76) has a lower end portion having a bent portion (76*a*) that is bent to protrude rightward. When the closed presser plate (64) is slid downwardly, the bent portion (76*a*) is engaged in the third hole (63*k*) of a corresponding one of the supporting members (63) to regulate the upward sliding of the presser plate (64).

The presser plate (64) includes a plurality of folded portions. The folded portions are each formed by bending a metal plate as described above, and linearly extend in a longitudinal direction. The folded portions function as stiffening ribs for increasing the longitudinal rigidity of the presser plate (64). This allows the longitudinal rigidity of the presser plate (64) to be greater than the rigidity of the presser plate (64) along the width thereof. The folded portions may form, for example, a substantial U-shape.

With such a configuration, when the presser plate (64) is fixed to the heat transfer plate (62) through the screws (91), the top portion (72*a*) of the second protrusion (72) is in contact with the flat top portion of the inner protrusion (66) of the heat transfer plate (62). In this case, the second protrusion (72) is elastically deformed so as to be displaced toward the heat transfer plate (62), i.e., backward (downward in FIG. 8(B)). Thus, the right side portion (71*c*) of the first protrusion (71) and the left side portion (73*b*) of the third protrusion (73) are also displaced backward. Consequently, the top portion (71*a*) of the first protrusion (71) and the top portion (73*a*) of the third protrusion (73) are not inclined in a front-to-rear direction, and each contact a corresponding one of the two straight pipe portions (16, 16) of the cooling pipe (15) to press the two straight pipe portions (16, 16) against the two grooves (61, 61) in the heat transfer plate (62) (see FIG. 4).

—Hinge Mechanism—

As illustrated in FIG. 3, the cooler (60) includes the hinge mechanism (77). The hinge mechanism (77) is used to rotatably attach the presser plate (64) to the heat transfer plate (62) such that the presser plate (64) is switched between an open position and a closed position. At the open position, the grooves (61) are exposed, and at the closed position, the presser plate (64) covers the grooves (61). In this embodiment, the hinge mechanism (77) includes the two T-shaped protrusion pieces (74, 74) of the presser plate (64), and one of the two curved portions (63*c*, 63*b*) of each supporting member (63) disposed to the left of the heat transfer plate (62), i.e., the second curved portion (63*c*) of the upper supporting member (63) and the first curved portion (63*b*) of the lower supporting member (63).

As described above, the first curved portion (63*b*) of each supporting member (63) has the first hole (63*h*) including the rectangular main hole portion (63*h*1) and the slender hole portion (63*h*2), and the second curved portion (63*c*) of the supporting member (63) has the rectangular second hole (63*i*). The vertical length of the rectangular main hole portion (63*h*1) of the first hole (63*h*) is less than the vertical length (the width of the T-shape) of the extension portion (74*b*) (see FIG. 8(A)) of each protrusion piece (74), and the vertical length of a front end portion of the first hole (63*h*)

(including a front end portion of the main hole portion (63*h*1) and the slender hole portion (63*h*2)) is greater than that of the extension portion (74*b*) of the protrusion piece (74). In contrast, the vertical length of the rectangular second hole (63*i*) is less than the vertical length (the width of the T-shape) of the extension portion (74*b*) (see FIG. 8(A)) of the protrusion piece (74). With such a configuration, if the protrusion piece (74) of an upper portion of the presser plate (64) is inserted into the second hole (63*i*) of the upper supporting member (63), and the protrusion piece (74) of a lower portion of the presser plate (64) is then inserted into the main hole portion (63*h*1) of the first hole (63*h*) of the lower supporting member (63) by utilizing the slender hole portion (63*h*2), the protrusion pieces (74, 74) are prevented from being each detached from a corresponding one of the main hole portion (63*h*1) of the first hole (63*h*) of the upper supporting member (63) and the second hole (63*i*) of the lower supporting member (63). In other words, the protrusion pieces (74, 74) of the presser plate (64) each engage a corresponding one of the second curved portion (63*c*) of the upper supporting member (63) and the first curved portion (63*b*) of the lower supporting member (63).

Furthermore, as described above, a front end portion of the first curved portion (63*b*) of each supporting member (63) having the first hole (63*h*) is curved such that with decreasing distance to the front end of the first curved portion (63*b*), the distance from the heat transfer plate (62) increases, and a front end portion of the second curved portion (63*c*) of the supporting member (63) having the second hole (63*i*) is curved such that with decreasing distance to the front end of the second curved portion (63*c*), the distance from the heat transfer plate (62) increases (see FIG. 4). Specifically, the curved portions (63*c*, 63*b*) are curved so as not to prevent the rotation of the presser plate (64) when the presser plate (64) is rotated together with the protrusion pieces (74, 74) such that the presser plate (64) is switched to the open position.

With such a configuration as described above, the second curved portion (63*c*) of the upper supporting member (63) and the first curved portion (63*b*) of the lower supporting member (63) are disposed to the left of the heat transfer plate (62), and each form the rotation supporter. In a situation where the protrusion pieces (74) forming the rotary protrusion pieces of the presser plate (64) are each inserted into a corresponding one of the holes (63*i*, 63*h*), the rotation supporter rotatably supports a corresponding one of the protrusion pieces (74). Such a hinge mechanism (77) is used to rotatably attach the presser plate (64) to the heat transfer plate (62) such that the presser plate (64) is switched between the open position and the closed position.

—Lock Mechanism—

The cooler (60) includes a lock mechanism (78). The lock mechanism (78) prevents the rotation of the presser plate (64) to keep the presser plate (64) closed. In this embodiment, the lock mechanism (78) includes the two L-shaped protrusion pieces (75, 75) of the presser plate (64), and one of the two curved portions (63*b*, 63*c*) of each supporting member (63) disposed to the right of the heat transfer plate (62), i.e., the first curved portion (63*b*) of the upper supporting member (63) and the second curved portion (63*c*) of the lower supporting member (63).

As described above, the vertical length of each of the main hole portion (63*h*1) of the first hole (63*h*) of the first curved portion (63*b*) and the second hole (63*i*) of the second curved portion (63*c*) is greater than the vertical length of the extension portion (75*b*) (see FIG. 8(A)) of each protrusion piece (75). In each supporting member (63), the locations of the first hole (63*h*) and the second hole (63*i*) correspond to each other. The locations of the two L-shaped protrusion pieces (75, 75) correspond to those of the two T-shaped protrusion pieces (74, 74). With such a configuration, when the presser plate (64) rotates with the hinge mechanism (77) so as to be closed, the two L-shaped protrusion pieces (75, 75) are each fitted into a corresponding one of the main hole portion (63*h*1) of the first hole (63*h*) of the first curved portion (63*b*) of the upper supporting member (63) and the second hole (63*i*) of the second curved portion (63*c*) of the lower supporting member (63). When, in this state, the presser plate (64) is slid downwardly, the L-shaped protrusion pieces (75, 75) are each caught (engaged) in a corresponding one of a wall surrounding the first hole (63*h*) and a wall surrounding the second hole (63*i*), and the presser plate (64) is thus locked to prevent the rotation of the presser plate (64). Even if an attempt is made to rotate the locked presser plate (64), the extension portions (75*b*, 75*b*) of the L-shaped protrusion pieces (75, 75) are each caught in a corresponding one of the wall surrounding the first hole (63*h*) and the wall surrounding the second hole (63*i*) to prevent the rotation of the presser plate (64). In contrast, when the locked presser plate (64) is slid upwardly, the L-shaped protrusion pieces (75, 75) are each separated from a corresponding one of the wall surrounding the first hole (63*h*) and the wall surrounding the second hole (63*i*), and the presser plate (64) is thus unlocked to allow the rotation of the presser plate (64).

With such a configuration as described above, the first curved portion (63*b*) of the upper supporting member (63) and the second curved portion (63*c*) of the lower supporting member (63) are disposed to the right of the heat transfer plate (62), and each form the rotation stopper. When the closed presser plate (64) is slid in one of directions along the length of each groove in the heat transfer plate (62), the rotation stopper engages a corresponding one of the protrusion pieces (75) forming the locking protrusion pieces to prevent the rotation of the presser plate (64). Such a lock mechanism (78) prevents the rotation of the presser plate (64) to keep the presser plate (64) closed.

—Sliding Reduction Mechanism—

The cooler (60) includes a sliding reduction mechanism (80) reducing the upward (upward in FIG. 3) sliding of the closed presser plate (64) to prevent the presser plate (64) locked by the lock mechanism (78) from being unlocked due to, for example, vibrations. In this embodiment, the sliding reduction mechanism (80) includes the second curved portion (63*c*) of the lower supporting member (63), and the leaf spring portion (76) of the presser plate (64). Specifically, the bent portion (76*a*) of the leaf spring portion (76) is fitted into the third hole (63*k*) when the presser plate (64) is locked by the lock mechanism (78). As such, the bent portion (76*a*) of the leaf spring portion (76) is fitted into the third hole (63*k*) so that the bent portion (76*a*) contacts a wall surrounding the third hole (63*k*) even with an upward (upward in FIG. 3) force applied to the presser plate (64) due to, for example, vibrations. This prevents the upward sliding of the presser plate (64). In contrast, when an operator applies a force to the presser plate (64) to slide the presser plate (64) upwardly, the leaf spring portion (76) is warped due to the reaction of the forces exerted on the wall surrounding the third hole (63*k*) by the bent portion (76*a*), and the bent portion (76*a*) is detached from the third hole (63*k*), and is in contact with the inner wall of the lower supporting member (63). This allows the presser plate (64) locked by the lock mechanism (78) to be unlocked.

—Operation—

Operation of the air conditioner (1) will be described with reference to FIG. 1. The air conditioner (1) selects one of a cooling operation and a heating operation to perform the one of the operations.

<Cooling Operation>

In the cooling operation, refrigerant compressed by the compressor (34) is condensed in the outdoor heat exchanger (31). The condensed refrigerant passes through, for example, the fully opened outdoor expansion valve (33), and flows through the cooling pipe (15).

During operation of the compressor (34), the power module (53) generates heat. Thus, the heat of the power module (53) is transferred through the heat transfer plate (62), the thermally conductive grease (79), and the cooling pipe (15) sequentially, and is released to the refrigerant in the cooling pipe (15). Consequently, the power module (53) is cooled, and the temperature of the power module (53) is kept at a predetermined temperature at which the power module (53) can operate.

The refrigerant that has flowed through the cooling pipe (15) is decompressed by the indoor expansion valve (23), and then evaporates in the indoor heat exchanger (21). Thus, indoor air is cooled. The evaporated refrigerant is sucked into the compressor (34), and is compressed.

<Heating Operation>

In the heating operation, refrigerant compressed by the compressor (34) is condensed in the indoor heat exchanger (21). Thus, indoor air is heated. The condensed refrigerant passes through, for example, the fully opened indoor expansion valve (23), and flows through the cooling pipe (15). The refrigerant flowing through the cooling pipe (15) absorbs heat from the power module (53) in the same manner as in the cooling operation, and the power module (53) is cooled. The refrigerant that has flowed through the cooling pipe (15) is decompressed by the outdoor expansion valve (33), and then evaporates in the outdoor heat exchanger (31). The evaporated refrigerant is sucked into the compressor (34), and is compressed.

—Assembly of Electrical Component Unit—

First, the heat transfer plate (62), the two supporting members (63), and the presser plate (64) are manufactured. Next, the supporting members (63) are each fixed to a corresponding one of both vertical end portions of the heat transfer plate (62) (see FIG. 5). In a situation where the heat transfer plate (62) is interposed between the two nail portions (63g, 63g) and the bottom portion (63d) of each supporting member (63), the supporting member (63) is fixed to the heat transfer plate (62) by inserting the screw (69) through the insertion hole (631) of the bottom portion (63d) and screwing the screw (69) into a corresponding one of the screw holes (68a) of the heat transfer plate (62). The power module (53) is placed on the heat transfer plate (62). Specifically, the screws (92) are screwed into the screw holes (68b) with a heat dissipation surface of the power module (53) being in contact with the flat top portion of the back protrusion (68) of the heat transfer plate (62), thereby placing the power module (53) on the heat transfer plate (62) such that the power module (53) is in thermal contact with the heat transfer plate (62) (see FIG. 4).

Next, the heat transfer plate (62) including the supporting members (63) and the power module (53) is temporarily fixed to the printed circuit board (51). Specifically, lead wires of the power module (53) and the supporting portions (63e, 63e) of each supporting member (63) are inserted through the through-holes formed in the printed circuit board (51). Here, a distal end portion of each supporting portion (63e) branches into two long slender nails. In contrast, the width of each through-hole of the printed circuit board (51) is slightly greater than that of the distal end portion of a corresponding one of the supporting portions (63e). Thus, the distal end portion of each supporting portion (63e) is passed through a corresponding one of the through-holes, and is then deformed so as to be twisted, thereby preventing the supporting portion (63e) from being detached from the corresponding one of the through-holes. As such, the distal end portion of the supporting portion (63e) engages the printed circuit board (51) to temporarily fix the heat transfer plate (62) including the supporting members (63) and the power module (53) to the printed circuit board (51).

After the temporal fixing, the lead wires of the power module (53) and the supporting portions (63e, 63e) of each supporting member (63) are fixed to the printed circuit board (51) by soldering. These components are soldered to the printed circuit board (51) by allowing the printed circuit board (51) to pass through a flow reactor. Specifically, the back surface of the printed circuit board (51) is immersed in a solder bath of the flow reactor to allow melting solder to pass through the back surface of the printed circuit board (51) and enter the through-holes into which the distal end portion of each supporting portion (63e) and the lead wires of the power module (53) are inserted.

Figure 9:
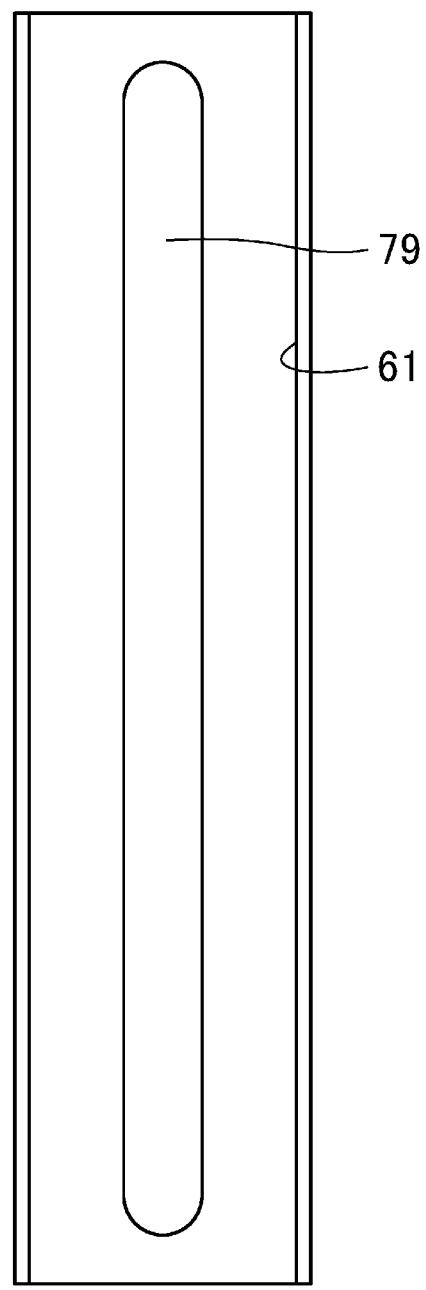
FIG. 9 is a schematic diagram illustrating thermally conductive grease applied into a groove in the heat transfer plate.

After the soldering, the two grooves (61) in the heat transfer plate (62) are coated with the thermally conductive grease (79). In this case, as illustrated in FIG. 9, the thermally conductive grease (79) is applied to a laterally central portion of each groove (61) to extend along the length of the groove. The thermally conductive grease (79) is applied to the laterally central portion of the groove (61) using, for example, a syringe enabling the control of the amount of the thermally conductive grease (79) applied thereto. When the straight pipe portions (16) of the cooling pipe (15) is pressed against the grooves (61), each groove (61) is coated with the thermally conductive grease (79). The amount of the applied thermally conductive grease (79) is large enough to fill the gap between the inner surface of the groove (61) and a corresponding one of the straight pipe portions (16).

After the thermally conductive grease. (79) is applied to the groove (61), the presser plate (64) is placed on the heat transfer plate (62). Specifically, the upper protrusion piece (74) of the presser plate (64) is first inserted into the second hole (63i) of the upper supporting member (63). Thereafter, the lower protrusion piece (74) of the presser plate (64) is inserted into the main hole portion (63h1) of the first hole (63h) of the lower supporting member (63) by utilizing the slender hole portion (63h2). Thus, the protrusion pieces (74, 74) of the presser plate (64) each engage a corresponding one of the second curved portion (63c) of the upper supporting member (63) and the first curved portion (63b) of the lower supporting member (63).

Figure 10:
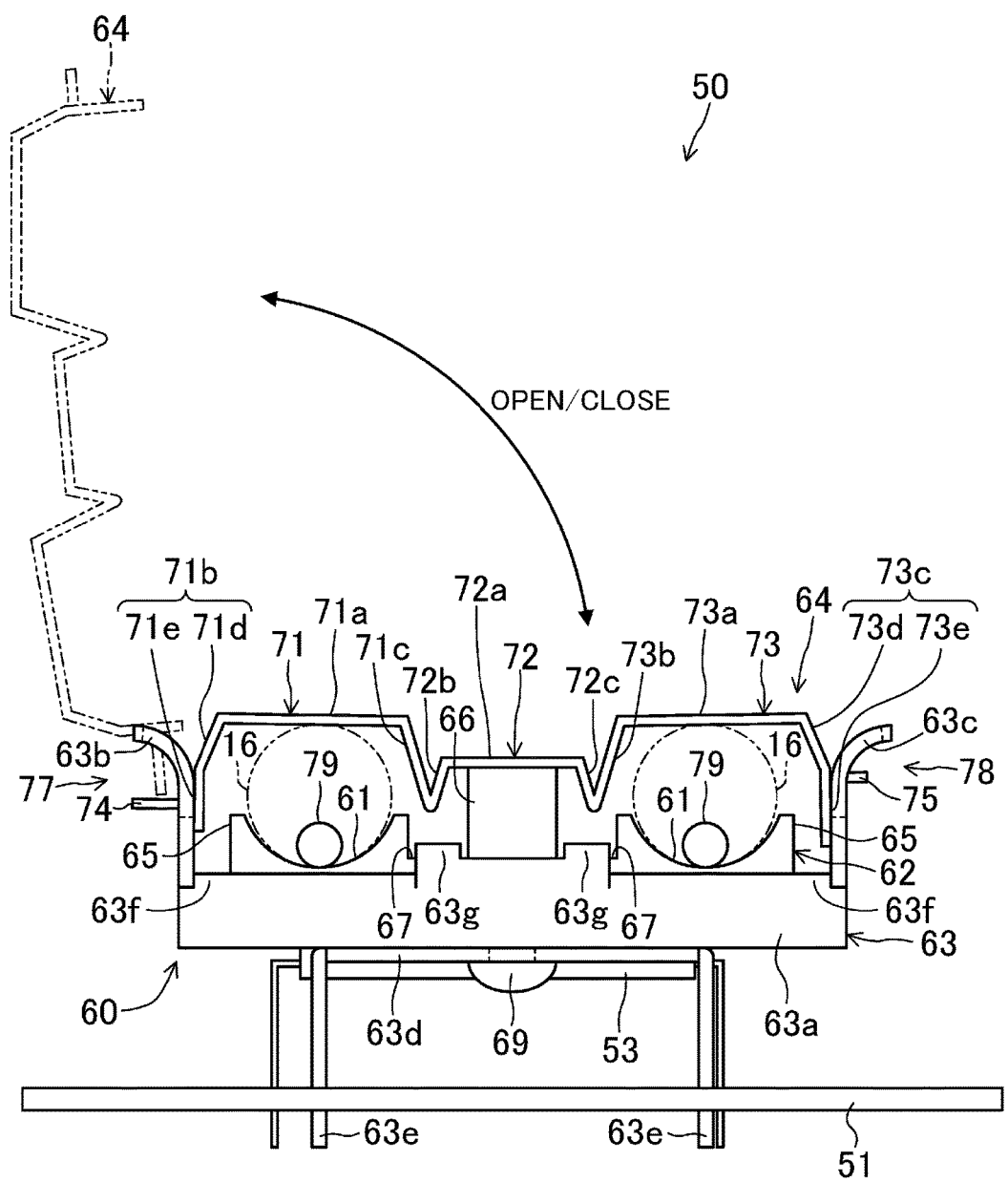
FIG. 10 is a plan view of an assembled electrical component unit that is yet to be installed.

After the presser plate (64) is placed on the heat transfer plate (62), the presser plate (64) is rotated with the hinge mechanism (77) so as to be closed, i.e., to cover the grooves (61) (see FIG. 10). Specifically, while the protrusion pieces (74, 74) each engage a corresponding one of the curved portions (63c, 63b) of a corresponding one of the supporting members (63), the presser plate (64) is rotated together with the protrusion pieces (74) such that the presser plate (64) is closed.

After the presser plate (64) is closed, the presser plate (64) is kept closed by the lock mechanism (78). Specifically, the closed presser plate (64) is slid downwardly, and the L-shaped protrusion pieces (75, 75) are each engaged in a corresponding one of the wall surrounding the first hole (63h) of the upper supporting member (63) and the wall surrounding the second hole (63i) of the lower supporting member (63). This prevents the rotation of the presser plate (64), and the presser plate (64) is kept closed.

The electrical component unit (50) assembled as above is transported to the site of installation of the electrical component unit (50) with the presser plate (64) kept closed by the lock mechanism (78) (see FIG. 10). In this embodiment, the cooler (60) includes the sliding reduction mechanism (80). For this reason, even if an upward force is exerted on the presser plate (64) by, for example, vibrations, the bent portion (76a) of the leaf spring portion (76) fitted into the third hole (63k) of the lower supporting member (63) is in contact with the wall surrounding the third hole (63k) to prevent the upward sliding of the presser plate (64). Thus, for example, vibrations occurring during transportation do not cause the presser plate (64) locked by the lock mechanism (78) to be unlocked, and the presser plate (64) is kept closed.

—Attachment of Electrical Component Unit—

First, the electrical component unit (50) is inserted into a region of the electrical component chamber (49) of the casing (40) behind the cooling pipe (15). At this time, the previously placed cooling pipe (15) is inclined forward as described above to increase the gap between the casing (40) and the cooling pipe (15). The electrical component unit (50) is inserted through the increased gap into the region of the electrical component chamber (49) to prevent the contact between the electrical component unit (50) and the cooling pipe (15), and is fixed through the fixing member (55) to the transverse partition (46) behind the cooling pipe (15) (see FIG. 2).

After the electrical component unit (50) is fixed to the casing (40), the cooling pipe (15) is fitted into the grooves (61) in the heat transfer plate (62) of the cooler (60). Specifically, the locked presser plate (64) of the cooler (60) is first slid upwardly of the heat transfer plate (62). This allows the two L-shaped protrusion pieces (75, 75) of the lock mechanism (78) to be each separated from the wall surrounding a corresponding one of the first hole (63h) and the second hole (63i), and the rotation of the presser plate (64) is allowed so that the presser plate (64) is unlocked. The unlocked presser plate (64) is rotated so as to be opened, thereby exposing the two grooves (61). Thereafter, the cooling pipe (15) inclined forward is returned to its original upright position under elastic force, and the two straight pipe portions (16) are each fitted into a corresponding one of the two grooves (61).

After the cooling pipe (15) is fitted into the grooves (61) of the heat transfer plate (62), the presser plate (64) is rotated so as to be closed. The closed presser plate (64) is slid downwardly so as to be locked. Thus, the presser plate (64) presses the cooling pipe (15) against the inner surfaces of the grooves (61) in the heat transfer plate (62), and is temporarily fixed to the heat transfer plate (62) before being finally fixed thereto with the screws (91).

Here, the thermally conductive grease (79) is applied to a laterally central portion of each groove (61) of the heat transfer plate (62) to extend along the groove length. For this reason, when the two straight pipe portions (16) of the cooling pipe (15) are pressed against the inner surfaces of the grooves (61) of the heat transfer plate (62), the thermally conductive grease (79) is spread thinly to extend along the groove width. This allows the small gap between the cooling pipe (15) and each groove (61) to be filled with the thermally conductive grease (79), reduces the contact thermal resistance between the cooling pipe (15) and the inner surface of the groove (61) of the heat transfer plate (62), and facilitates transferring heat between the cooling pipe (15) and the heat transfer plate (62).

After the presser plate (64) is temporarily fixed to the heat transfer plate (62) by the lock mechanism (78), the presser plate (64) is finally fixed thereto with the screws (91). To finally fix the presser plate (64) to the heat transfer plate (62), the screws (91) are inserted through the insertion holes (72d) of the presser plate (64), and are screwed into the screw holes (66a) of the heat transfer plate (62). Since, in this case, the presser plate (64) is temporarily fixed to the heat transfer plate (62), the cooling pipe (15) is pressed against the inner surfaces of the grooves (61) of the heat transfer plate (62) by the presser plate (64) even if an operator does not press the presser plate (64). This allows the operator to screw the screws (91) without supporting the presser plate (64).

When the presser plate (64) is fixed to the heat transfer plate (62) with the screws (91), the second protrusion (72) is elastically deformed so as to be displaced toward the heat transfer plate (62). Thus, the right side portion (71c) of the first protrusion (71) and the left side portion (73b) of the third protrusion (73) are also displaced toward the heat transfer plate (62). Consequently, the top portion (71a) of the first protrusion (71) and the top portion (73a) of the third protrusion (73) are each in contact with a corresponding one of the two straight pipe portions (16, 16) of the cooling pipe (15). Thus, the two straight pipe portions (16, 16) are each pressed against a corresponding one of the two grooves (61, 61) of the heat transfer plate (62) (see FIG. 4).

In view of the foregoing, the electrical component unit (50) is placed in the casing (40), and the cooling pipe (15) is placed on the cooler (60).

Advantages of Embodiment

According to the embodiment, the hinge mechanism (77) through which the presser plate (64) is rotatably attached to the heat transfer plate (62) is provided such that the presser plate (64) is switched between an open position at which the grooves (61) are exposed and a closed position at which the presser plate (64) covers the grooves (61). For this reason, when the cooler (60) including the heat transfer plate (62) having the grooves (61) coated with the thermally conductive grease (79) is transported to the site of installation of the cooler (60), the presser plate (64) is closed to protect the thermally conductive grease (79), thereby preventing the removal of the thermally conductive grease (79) arising from the drying thereof or contact therewith. In other words, the cooler (60) can be transported to the site of installation of the cooler (60) with the thermally conductive grease (79) protected without increasing cost due to the provision of a cover separate from the components of the cooler (60). Also at the site of installation, after the presser plate (64) is opened, and the cooling pipe (15) is fitted into the grooves (61) of the heat transfer plate (62), the presser plate (64) is rotated so as to be closed. This allows the presser plate (64) to be easily fixed to the heat transfer plate (62) without supporting the presser plate (64) with a hand. In view of the foregoing, according to the embodiment, the placement of the cooling pipe (15) on the cooler (60) can be facilitated, and a cover having been conventionally used can be omitted to reduce cost.

According to the embodiment, the lock mechanism (78) is provided to prevent the rotation of the presser plate (64) and keep the presser plate (64) closed. For this reason, when the cooler (60) is transported to the site of installation of the cooler (60), the presser plate (64) can be kept closed by the lock mechanism (78). This can ensure the protection of the thermally conductive grease (79). At the site of installation, after the cooling pipe (15) is fitted into the grooves (61) of the heat transfer plate (62), the presser plate (64) is kept closed by the lock mechanism (78), and the presser plate (64) can be thus fixed to the heat transfer plate (62) without pressing the presser plate (64) with the hand. This can facilitate fixing the presser plate (64), and facilitate placing the cooling pipe (15) on the cooler (60).

According to the embodiment, the hinge mechanism (77) includes the T-shaped protrusion pieces (74) and a corresponding one of the curved portions (63b, 63c) of each supporting member (63, 63). The T-shaped protrusion pieces (74) protrude from the left side portion (71b) of the first protrusion (71) being an end portion of the presser plate (64) near the axis of rotation of the presser plate (64). The corresponding one of the curved portions (63b, 63c) is provided on one side of the heat transfer plate (62) located in the width direction of the groove (on a left side of the heat transfer plate (62)), and serves as the rotation supporter that rotatably supports a corresponding one of the T-shaped protrusion pieces (74). For this reason, the opening/closing mechanism (77) can have a simple configuration.

According to the embodiment, the lock mechanism (78) includes the L-shaped protrusion pieces (75) and a corresponding one of the curved portions (63c, 63b) of each supporting member (63, 63). The L-shaped protrusion pieces (75) protrude from the right side portion (73c) of the third protrusion (73) being an end portion of the presser plate (64) remote from the axis of rotation of the presser plate (64). The corresponding one of the curved portions (63c, 63b) is provided on the other side of the heat transfer plate (62) located in the width direction of the groove and remote from the rotation supporters, i.e., on a right side of the heat transfer plate (62), and serves as the rotation stopper that, when the closed presser plate (64) is slid, engages a corresponding one of the L-shaped protrusion pieces (75) to prevent the rotation of the presser plate (64). Thus, the lock mechanism (78) can have a simple configuration. An easy operation in which the presser plate (64) is merely slid prevents the rotation of the presser plate (64), and the presser plate (64) can be kept closed.

According to the embodiment, the supporting members (63) each having the rotation supporter and the rotation stopper are placed on the heat transfer plate (62). For this reason, the heat transfer plate (62) can be easily provided with the rotation supporter and the rotation stopper only by placing the supporting members (63) on the heat transfer plate (62) that does not include the rotation supporter and the rotation stopper.

When a specific portion of each supporting member (63) serves as the rotation supporter, and another specific portion thereof serves as the rotation stopper, the two supporting members (63) each placed on a corresponding one of one end and the other end of the heat transfer plate (62) in the longitudinal direction of the grooves (61) cannot be formed in the same shape. In other words, if the two supporting members (63) are formed in the same shape, one of the supporting members (63) can be placed on the one end of the heat transfer plate (62) in the longitudinal direction of the grooves (61) such that the rotation supporter is provided on one side of the heat transfer plate (62) in the groove width direction and the rotation stopper is provided on the other side thereof in the groove width direction, whereas the other one of the supporting members (63) cannot be placed on the other end of the heat transfer plate (62) in the longitudinal direction of the grooves (61) such that the rotation supporter is provided on the one side of the heat transfer plate (62) in the groove width direction and the rotation stopper is provided on the other side thereof.

In contrast, in the embodiment, the two supporting members (63, 63) each include the curved portions (63b, 63c). The curved portions (63b, 63c) correspond to the two engagement portions provided laterally outward of the heat transfer plate (62) along the groove width to each function as both the rotation supporter and the rotation stopper. For this reason, even if the two supporting members (63, 63) are formed in the same shape, the supporting members (63) can be each placed on a corresponding one of the one end and the other end of the heat transfer plate (62) in the longitudinal direction of the grooves (61) such that the rotation supporter is provided on one side of the heat transfer plate (62) in the groove width direction and the rotation stopper is provided on the other side thereof. For this reason, even if one of the two supporting members (63, 63) is placed on either of two portions of the heat transfer plate (62) on which the supporting members (63) are to be placed, the hinge mechanism (77) and the lock mechanism (78) can be formed. This prevents the two supporting members (63, 63) from being placed on the heat transfer plate (62) by mistake. Furthermore, the need for forming two types of the supporting members (63) is eliminated, thereby reducing the degree of increase in cost for manufacturing the supporting members (63, 63).

According to the embodiment, the thermally conductive grease (79) is applied to the laterally central portions of the grooves (61) of the heat transfer plate (62) to extend along the groove length. For this reason, when the cooling pipe (15) is placed on the cooler (60), only fitting the cooling pipe (15) into the grooves (61) allows the thermally conductive grease (79) to be thinly and widely spread. In other words, the thermally conductive grease (79) does not need to be spread using a roller or any other tool, and both the application of the thermally conductive grease (79) to the grooves (61) and the placement of the cooling pipe (15) on the cooler (60) can be facilitated.

According to the embodiment, the liquid pipe (15) of the refrigerant circuit (10) is fitted into the grooves (61) of the heat transfer plate (62) of the cooler (60) of the electrical component unit (50), and the power module (53) can be thus fully cooled by liquid refrigerant through the refrigerant circuit (10).

Other Embodiments

In the embodiment, the presser plate (64) forming a presser member according to the present invention is a metal plate having a shape substantially matched to the outer shape of the heat transfer plate (62) forming a heat transfer member. However, the presser member should not be limited to such a plate as in the embodiment. The presser member may be not a plate but, for example, a grid member. If such a grid member is closed to cover the grooves (61), it can also protect the thermally conductive grease (79) applied to the grooves (61) to prevent the removal of the thermally conductive grease (79) arising from contact with the thermally conductive grease (79).

While, in the embodiment, the cooler (60) is connected to a portion of the liquid pipe between the indoor expansion valve (23) and the outdoor expansion valve (33) of the refrigerant circuit (10), the location to which the cooler (60)

is connected should not be limited to the portion of the liquid pipe therebetween. The cooler (60) may be provided between the indoor expansion valve (23) and the indoor heat exchanger (21) of the refrigerant circuit (10) or between the indoor heat exchanger (21) and the four-way valve (35).

In the embodiment, the air conditioner (1) has been described as an example refrigeration apparatus performing a refrigeration cycle. Meanwhile, for example, a heat pump-type chiller unit, a hot water supply system, or a cooling apparatus for cooling the inside of a refrigerator or a freezer may be used as the refrigerating apparatus.

INDUSTRIAL APPLICABILITY

As described above, the present invention is useful for coolers placed on a refrigerant pipe to cool a heat generating component, electrical component units, and refrigeration apparatuses.

DESCRIPTION OF REFERENCE CHARACTERS

1 Air Conditioner (Refrigeration Apparatus)
10 Refrigerant Circuit
15 Cooling Pipe (Refrigerant Pipe, Liquid Pipe)
50 Electrical Component Unit
51 Printed Circuit Board (Substrate)
53 Power Module (Heat Generating Component)
60 Cooler
61 Groove
62 Heat Transfer Plate (Heat Transfer Member)
63 Supporting Member (Engagement Member)
63b First Curved Portion (Engagement Portion)
63c Second Curved Portion (Engagement Portion)
64 Presser Plate (Presser Member)
74 Protrusion Piece (Rotary Protrusion Piece)
75 Protrusion Piece (Locking Protrusion Piece)
77 Hinge Mechanism (Opening/Closing Mechanism)
78 Lock Mechanism
79 Thermally Conductive Grease

The invention claimed is:

1. A cooler for cooling a heat generating component with refrigerant flowing through a refrigerant pipe, the cooler comprising:
  a heat transfer member having a groove into which the refrigerant pipe is fitted, and
  a presser plate configured to directly press the refrigerant pipe against the groove, the presser plate being rotatably attached to the heat transfer member such that the presser plate switches between an open position at which the groove is exposed and a closed position at which the presser plate covers the groove,
  a lock mechanism configured to prevent rotation of the presser plate to keep the presser plate in the closed position,
  a rotary protrusion piece protruding from an end portion of the presser plate near an axis of rotation of the presser plate, and
  a rotation supporter provided on one side of the heat transfer member in a direction of the groove width to engage the rotary protrusion piece and rotatably support the rotary protrusion piece,
  wherein the presser plate is large enough to cover the entire groove when closed.

2. The cooler of claim 1, wherein the lock mechanism includes
  a locking protrusion piece protruding from an end portion of the presser plate remote from the axis of rotation of the presser plate, and
  a rotation stopper provided on the other side of the heat transfer member that is located in the width direction of the groove and is remote from the rotation supporter, and
  when the presser plate in the closed position is slid in one of directions along a length of the groove of the heat transfer member, the rotation stopper engages the locking protrusion piece to prevent the rotation of the presser plate.

3. The cooler of claim 2, wherein an engagement member having the rotation supporter and the rotation stopper is placed on the heat transfer member.

4. The cooler of claim 3, wherein
  the engagement member includes two identically shaped engagement members each placed on a corresponding one of one end and the other end of the heat transfer member along the length of the groove,
  the two identically shaped engagement members each include
    two engagement portions each provided on a corresponding one of both sides of the heat transfer member along the width of the groove, and each being capable of engaging either the rotary protrusion piece or the locking protrusion piece, and
    if one of the two engagement portions engages the rotary protrusion piece, the one of the two engagement portions serves as the rotation supporter, and if the one of the two engagement portions engages the locking protrusion piece, the one of the two engagement portions serves as the rotation stopper.

5. The cooler of claim 1, wherein thermally conductive grease is applied to a laterally central portion of the groove to extend along a length of the groove.

6. An electrical component unit comprising:
  a substrate on which a heat generating component is placed; and
  the cooler of claim 1 placed on the heat generating component.

7. A refrigeration apparatus including a refrigerant circuit through which refrigerant circulates to perform a vapor compression refrigeration cycle, the refrigeration apparatus comprising:
  the electrical component unit of claim 6, wherein
  a liquid pipe of the refrigerant circuit is fitted into the groove of the cooler of the electrical component unit.

8. The cooler of claim 2, wherein thermally conductive grease is applied to a laterally central portion of the groove to extend along a length of the groove.

9. The cooler of claim 3, wherein thermally conductive grease is applied to a laterally central portion of the groove to extend along a length of the groove.

10. The cooler of claim 4, wherein thermally conductive grease is applied to a laterally central portion of the groove to extend along a length of the groove.

* * * * *